(12) United States Patent
Friend et al.

(10) Patent No.: US 10,908,318 B2
(45) Date of Patent: Feb. 2, 2021

(54) LUMINESCENT DEVICE

(71) Applicants: CAMBRIDGE ENTERPRISE LIMITED, Cambridge, Cambridgeshire (GB); KING ABDULAZIZ CITY FOR SCIENCE & TECHNOLOGY, Riyadh (SA)

(72) Inventors: Richard Henry Friend, Cambridge (GB); Guangru Li, Heilongjiang (CN); Dawei Di, Cambridge (GB); Reza Saberi Moghaddam, Cambridge (GB); Zhi Kuang Tan, Singapore (SG)

(73) Assignees: CAMBRIDGE ENTERPRISE LIMITED, Cambridge (GB); KING ABDULAZIZ CITY FOR SCIENCE & TECHNOLOGY, Riyadh (SA)

( * ) Notice: Subject to any disclaimer, the term of this patent is extended or adjusted under 35 U.S.C. 154(b) by 0 days.

(21) Appl. No.: 15/740,509

(22) PCT Filed: Jun. 30, 2016

(86) PCT No.: PCT/EP2016/065262
§ 371 (c)(1),
(2) Date: Dec. 28, 2017

(87) PCT Pub. No.: WO2017/001542
PCT Pub. Date: Jan. 5, 2017

(65) Prior Publication Data
US 2018/0196164 A1 Jul. 12, 2018

(30) Foreign Application Priority Data
Jun. 30, 2015 (GB) .................................. 1511490.3
Oct. 30, 2015 (GB) .................................. 1519269.3

(51) Int. Cl.
G02B 1/02 (2006.01)
H01L 51/50 (2006.01)
(Continued)

(52) U.S. Cl.
CPC ................. *G02B 1/02* (2013.01); *G02B 1/04* (2013.01); *G02B 5/206* (2013.01); *H01L 27/322* (2013.01);
(Continued)

(58) Field of Classification Search
None
See application file for complete search history.

(56) References Cited

U.S. PATENT DOCUMENTS

2002/0086446 A1 * 7/2002 Charpentier ............ H01L 28/55
438/3
2010/0133989 A1 6/2010 Stiles et al.
(Continued)

FOREIGN PATENT DOCUMENTS

CN 104183697 A 12/2014
JP 2008-227330 A 9/2008
(Continued)

OTHER PUBLICATIONS

Gao et al., Organohalide lead perovskites for photovoltaic applications. Energy & Environmental Sciences. Apr. 29, 2014;7(8):2448-2463.
(Continued)

*Primary Examiner* — Michelle Mandala
(74) *Attorney, Agent, or Firm* — McCarter & English, LLP; Yu Lu; Wei Song

(57) ABSTRACT

We describe a luminescent device (120, 130) comprising a substrate (102) and a film comprising perovskite crystals (122, 132) deposited on the substrate, wherein the film comprising perovskite crystals is encapsulated with a layer
(Continued)

(124, 134)) or within a matrix (124, 134) of an insulating oxide or an insulating nitride.

17 Claims, 19 Drawing Sheets

(51) Int. Cl.
      H01L 27/32      (2006.01)
      G02B 5/20       (2006.01)
      G02B 1/04       (2006.01)
      H01L 51/00      (2006.01)
      B82Y 20/00      (2011.01)
      B82Y 40/00      (2011.01)

(52) U.S. Cl.
      CPC ........ *H01L 51/005* (2013.01); *H01L 51/0013* (2013.01); *H01L 51/502* (2013.01); *B82Y 20/00* (2013.01); *B82Y 40/00* (2013.01); *H01L 2251/303* (2013.01); *H01L 2251/308* (2013.01)

(56) References Cited

U.S. PATENT DOCUMENTS

| | | | |
|---|---|---|---|
| 2011/0121722 A1 | 5/2011 | Takashima et al. | |
| 2013/0026371 A1* | 1/2013 | Holloway | G01T 1/16 250/362 |
| 2014/0175393 A1* | 6/2014 | Beak | H01L 27/3265 257/40 |

FOREIGN PATENT DOCUMENTS

| | | |
|---|---|---|
| JP | 2014-078392 A | 5/2014 |
| JP | 2014-082377 A | 5/2014 |
| JP | 2015517736 A | 6/2015 |
| JP | 2017-112186 A | 6/2017 |
| JP | 2018-504787 A | 2/2018 |
| WO | 2004/022637 A2 | 3/2004 |
| WO | 2007/109734 A2 | 9/2007 |
| WO | 2009/054946 A1 | 4/2009 |
| WO | 2009/104595 A1 | 8/2009 |
| WO | 2013/171517 A1 | 11/2013 |
| WO | 2014/045021 A1 | 3/2014 |
| WO | 2015/166006 A1 | 11/2015 |
| WO | 2015/189551 A1 | 12/2015 |
| WO | 2016/083783 A1 | 6/2016 |
| WO | 2017/160955 A1 | 9/2017 |

OTHER PUBLICATIONS

Giorgi et al., Organic-Inorganic Hybrid Lead Iodide Perovskite Featuring Zero Dipole Moment Guanidinium Cations: A Theoretical Analysis. J Phys Chem C. 2015;119(9):4694-4701.
Hoye et al., Enhanced performance in fluorene-free organometal halide perovskite light-emitting diodes using tunable low electron affinity oxide electron injectors. Adv Mater Feb. 25, 2015;27(8):1414-9.
Li et al., Efficient light-emitting diodes based on nanocrystalline perovskite in a dielectric polymer matrix. Nano Lett. Apr. 8, 2015;15(4):2640-4.
Zaghdoudi et al., Synthesis, optical and structural properties of quantum-wells crystals grown into porous alumina. Superlattices and Microstructures. Jul. 2014;71:117-123.
Bai et al., High-performance planar heterojunction perovskite solar cells: Preserving long charge carrier diffusion lengths and interfacial engineering. Nano Research. 2014;7(12):1749-1758.
Barkhouse et al., Thiols passivate recombination centers in colloidal quantum dots leading to enhanced photovoltaic device efficiency. ACS Nano. Nov. 25, 2008;2(11):2356-62.
Burschka et al., Sequential deposition as a route to high-performance perovskite-sensitized solar cells. Nature. Jul. 18, 2013;499(7458):316-9.

Chang et al., High near-infrared photoluminescence quantum efficiency from PbS nanocrystals in polymer films. Synthetic Metals. 2005;148:257-261.
Cho et al., High-performance crosslinked colloidal quantum-dot light-emitting diodes. Nature Photonics. Jun. 2009;3:341-345.
Colvin et al., Light-emitting diodes made from cadmium selenide nanocrystals and a semiconducting polymer. Nature. Aug. 1994;370:354-357.
De La Pena et al., Mapping titanium and tin oxide phases using EELS: an application of independent component analysis. Ultramicroscopy. Jan. 2011;111(2):169-76.
Ehrler et al., In situ measurement of exciton energy in hybrid singlet-fission solar cells. Nat Commun. 2012;3:1019. 6 pages.
Greenham et al., Angular Dependence of the Emission from a Conjugated Polymer Light-Emitting Diode: Implications for Efficiency Calculations. Adv Mater. 1994;6(6):491-494.
Hoke et al., Reversible photo-induced trap formation in mixed-halide hybrid perovskites for photovoltaics. Chem Sci. Jan. 1, 2015;6(1):613-617.
Hwang et al., Photoelectron Spectroscopic Study of the Electronic Band Structure of Polyfluorene and Fluorene-Arylamine Copolymers at Interfaces. J Phys Chem C. 2007;111:1378-1384.
Kagan et al., Electronic energy transfer in CdSe quantum dot solids. Phys Rev Lett. Feb. 26, 1996;76(9):1517-1520.
Kojima et al., Organometal halide perovskites as visible-light sensitizers for photovoltaic cells. J Am Chem Soc. May 6, 2009;131(17):6050-1.
Lee et al., Efficient hybrid solar cells based on meso-superstructured organometal halide perovskites. Science. Nov. 2, 2012;338(6107):643-7.
Likovich et al., High-current-density monolayer CdSe/ZnS quantum dot light-emitting devices with oxide electrodes. Adv Mater. Oct. 18, 2011;23(39):4521-5.
Murray et al., Synthesis and Characterization of Nearly Monodisperse CdE (E=S, Se, Te) Semiconductor Nanocrystallites. J Am Chem Soc. 1993;115:8706-8715.
Noh et al., Chemical management for colorful, efficient, and stable inorganic-organic hybrid nanostructured solar cells. Nano Lett. Apr. 10, 2013;13(4):1764-9.
Pourret et al., Atomic Layer Deposition of ZnO in Quantum Dot Thin Films. Adv Mater. 2008;20:1-4.
Protesescu et al., Nanocrystals of Cesium Lead Halide Perovskites (CsPbX3, X=Cl, Br, and I): Novel Optoelectronic Materials Showing Bright Emission with Wide Color Gamut Nano Lett. Jun. 10, 2015;15(6):3692-6.
Song et al., Quantum Dot Light-Emitting Diodes Based on Inorganic Perovskite Cesium Lead Halides (CsPbX3 ). Adv Mater. Nov. 25, 2015;27(44):7162-7.
Steigerwald et al., Surface Derivatization and Isolation of Semiconductor Cluster Molecules. J Am Chem Soc. 1988;110:3046-3050.
Stoumpos et al., Crystal Growth of the Perovskite Semiconductor CsPbBr3: A New Material for High-Energy Radiation Detection. Cryst Growth Des. 2013;13:2722-2727.
Tan et al., Bright light-emitting diodes based on organometal halide perovskite. Nat Nanotechnol. Sep. 2014;9(9):687-92.
Tang et al., Colloidal-quantum-dot photovoltaics using atomic-ligand passivation. Nat Mater. Oct. 2011;10(10):765-71.
Tarte, Infra-red spectra of inorganic aluminates and characteristic vibrational frequencies of AlO4 tetrahedra and AlO6 octahedra. Spectrochimica Acta. 1967;23A:2127-2143.
Wang et al., Interfacial control toward efficient and low-voltage perovskite light-emitting diodes. Adv Mater. Apr. 8, 2015;27(14):2311-6.
Yakunin et al., Low-threshold amplified spontaneous emission and lasing from colloidal nanocrystals of caesium lead halide perovskites. Nat Commun. Aug. 20, 2015;6:8056. Erratum in: Nat Commun. 2015;6:8056 and 8515 9 pages.
Zhang et al., Brightly Luminescent and Color-Tunable Colloidal CH3NH3PbX3 (X=Br, I, Cl) Quantum Dots: Potential Alternatives for Display Technology. ACS Nano. Apr. 28, 2015;9(4):4533-42.

(56) References Cited

OTHER PUBLICATIONS

Ayguler et al., Light-Emitting Electrochemical Cells Based on Hybrid Lead Halide Perovskite Nanoparticles. J Phys Chem C. 2015;119:12047-12054.

Lu et al., Blue-shift and intensity enhancement of photoluminescence in lead-zirconate-titanate-doped silica nanocomposites. Nanotechnology. 2008;19:035702, 4 pages.

* cited by examiner

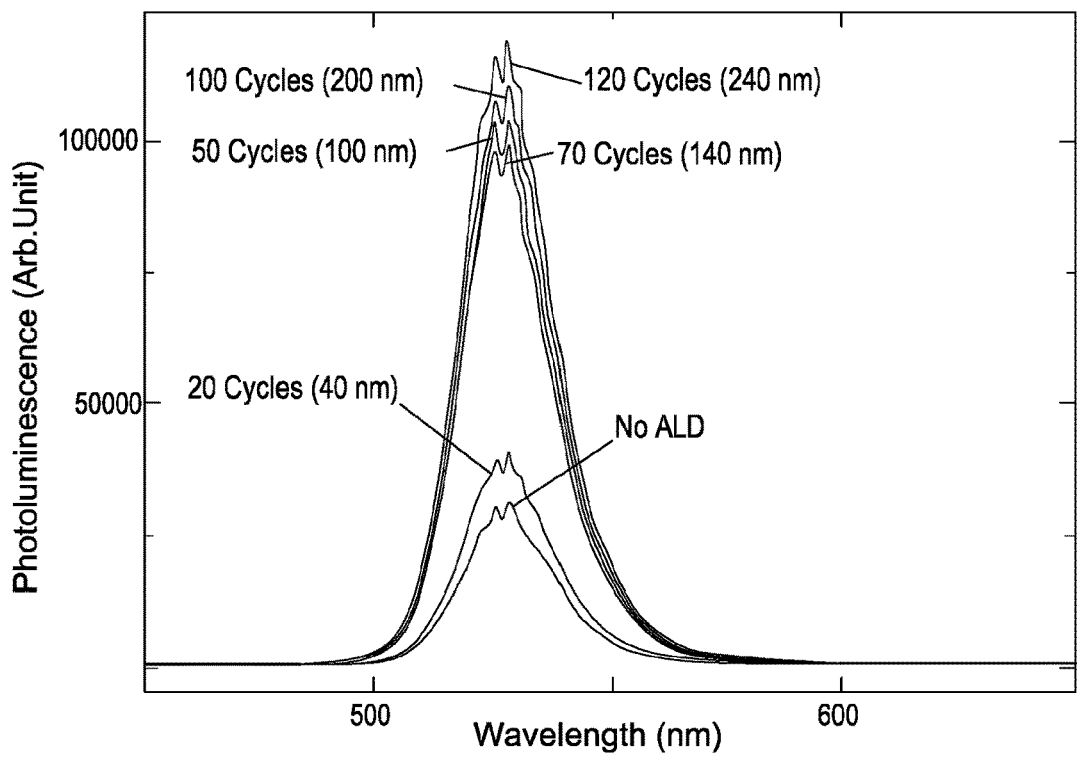
Fig. 3a
Fig. 3b
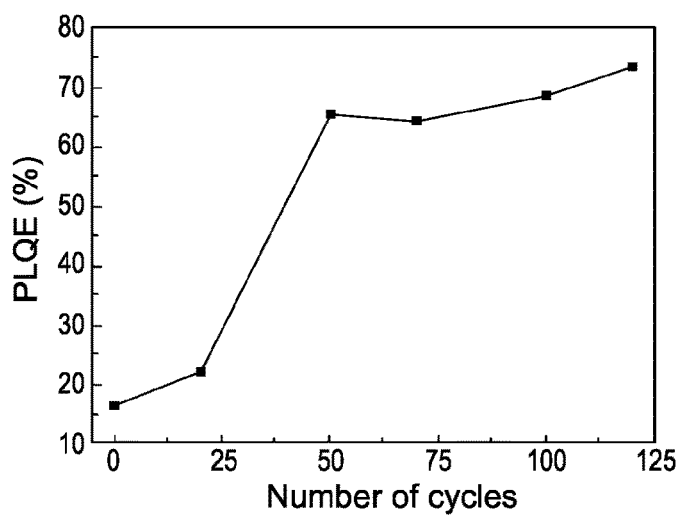
| ALD Cycles (Al$_2$O$_3$ thickness) | PLQE (%) |
|---|---|
| 0 | 16.6 |
| 20 (40 nm) | 22.1 |
| 50 (100 nm) | 65.7 |
| 70 (140 nm) | 64.4 |
| 100 (200 nm) | 68.7 |
| 120 (240 nm) | 73.7 |
Fig. 3c

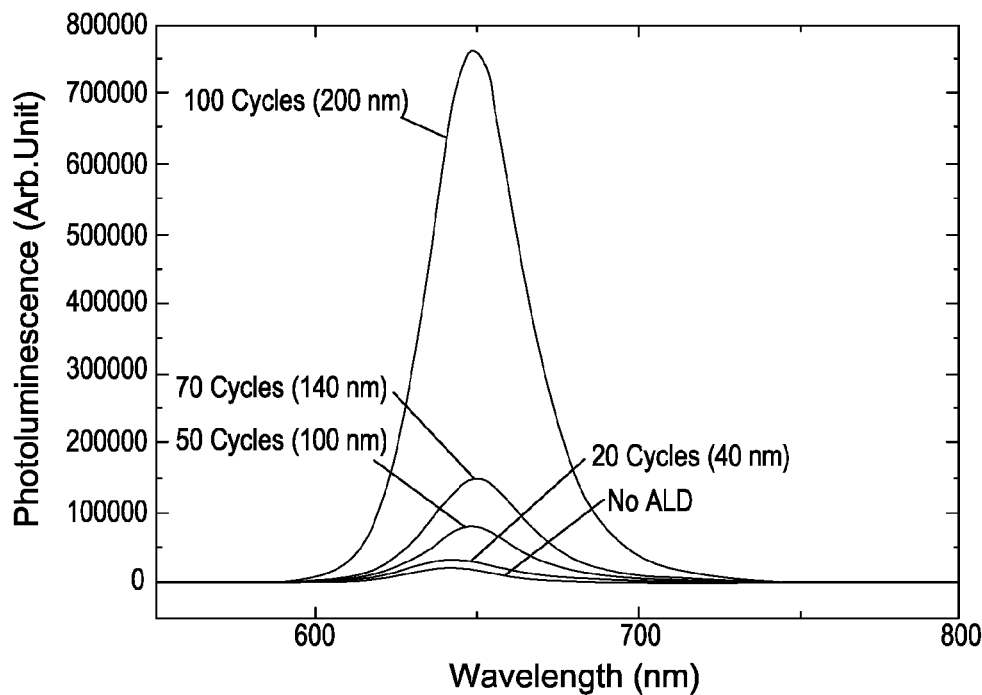
Fig. 4a
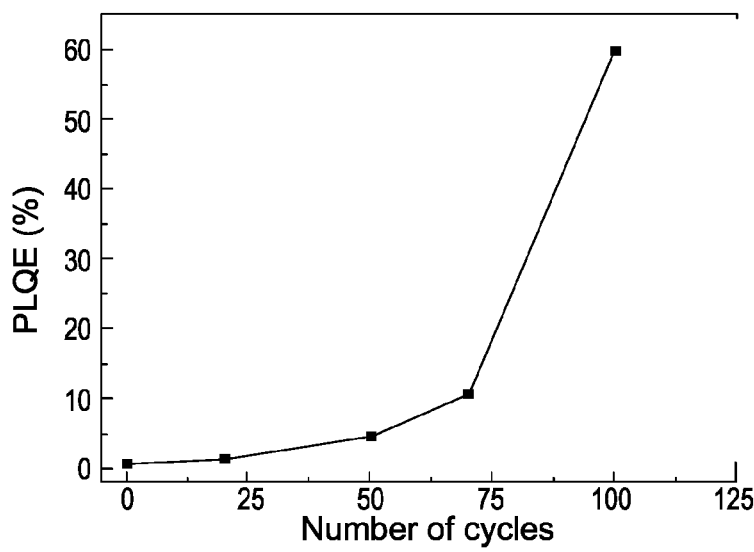
Fig. 4b
| ALD Cycles (Al$_2$O$_3$ thickness) | PLQE (%) |
|---|---|
| 0 | 0.8 |
| 20 (40 nm) | 1.5 |
| 50 (100 nm) | 4.7 |
| 70 (140 nm) | 10.8 |
| 100 (200 nm) | 59.8 |
Fig. 4c

LUMINESCENT DEVICE

CROSS-REFERENCE TO RELATED APPLICATIONS

This application is a U.S. national stage application, filed under 35 U.S.C. § 371(c), of International Application No. PCT/EP2016/065262, filed on Jun. 30, 2016, which claims priority to United Kingdom Patent Application No. 1511490.3, filed on Jun. 30, 2015; and United Kingdom Patent Application No. 1519269.3, filed on Oct. 30, 2015. The entire contents of each of the aforementioned applications are incorporated herein by reference.

FIELD OF THE INVENTION

This invention generally relates to luminescent devices comprising a film comprising perovskite crystals encapsulated with a layer or within a matrix of an insulating oxide, an insulating nitride or an insulating metal oxide/hydroxide network, and methods for preparing such luminescent devices.

BACKGROUND TO THE INVENTION

We have previously described, in our co-pending applications GB 1407606.1 and GB 1421133.8, perovskite-based light-emitting devices. Light-emitting devices based on earth-abundant organometal halide perovskite materials have recently been shown to exhibit bright and colour-controlled electroluminescence (see Tan, Z.-K. et al., Nature Nanotechnology 9, 687-692 (2014)). Typical examples of devices disclosed in Tan et al. include $TiO_2/CH_3NH_3PbI_{3-x}Cl_x/F8$ film structures. In some of these devices, a thin layer of $Al_2O_3$ is included above the $TiO_2$ and under the $CH_3NH_3PbI_{3-x}Cl_x$ as a layer between the two to optimise device efficiencies and minimise luminescence, the $Al_2O_3$ acting as a barrier to holes from the other electrode. F. Zhang et al. (ACS Nano, 2015, 9 (4), pp. 4533-4542) have reported brightly luminescent and colour-tunable colloidal $CH_3NH_3PbX_3$ (X=Br, I, Cl) quantum dots with absolute quantum yield up to 70% at room temperature and low excitation fluencies. Further prior art relating to perovskite-based photoluminescent devices can be found in, e.g. L. Protesescu et al., Nano Lett. 2015, 15, 3692-3696.

However, there is a need for further improvements of perovskite-based photoluminescent devices.

SUMMARY OF THE INVENTION

According to a first aspect of the invention, there is therefore provided a luminescent device comprising a substrate and a film comprising perovskite crystals deposited on the substrate, wherein the film comprising perovskite crystals is encapsulated with a layer or within a matrix of an insulating oxide or an insulating nitride.

The luminescent device may be a photoluminescent device. We note that references throughout the description to the device being a photoluminescent device (which may be excited by photoabsorption to give the photoluminescent device) are equally applicable to devices which may be excited by electrical excitation, which may require electrical connections above and below the perovskite crystal layer or film, to give an electroluminescent device, or for example a light-emitting diode. Therefore, preferred embodiments to the photoluminescent device described herein are equally applicable to a luminescent device as described throughout the specification.

The inventors have realised that by encapsulating the film comprising perovskite crystals with a layer or within a matrix of an insulating oxide or an insulating nitride, the photoluminescence yield of the perovskite crystals is substantially the same or even higher compared to a substantially similar photoluminescent device in which the encapsulation layer or matrix has been omitted. This is a surprising result as one would generally expect that an encapsulation layer or matrix deposited onto the film comprising perovskite crystals would result in an introduction of electronic defect states at or near the surface of the perovskite material during deposition of the encapsulation layer or matrix, thereby decreasing the photoluminescence yield of the perovskite crystals. The inventors have instead observed that the photoluminescence yield of the encapsulated perovskite crystals is the same or even higher compared to substantially similar, pristine perovskite crystals deposited on a substrate. 'Pristine' refers hereby to a film comprising perovskite crystals prior to operation of the photoluminescent device, since the photoluminescence yield of the non-encapsulated perovskite crystals decreases during operation of the photoluminescent device, for example in air, as will be described below.

Furthermore, the encapsulation layer or matrix advantageously increases a stability of the film comprising perovskite crystals to one or more of: a photo-induced degradation of the perovskite crystals, an exposure of the encapsulated device to oxygen and/or water, and a thermal degradation of the perovskite crystals, as will be further described below.

Therefore, in a preferred embodiment of the photoluminescent device, the layer or matrix of insulating oxide or insulating nitride is configured to prevent a reduction of a photoluminescence yield of the perovskite crystals during operation of the photoluminescent device.

The layer or matrix of insulating oxide or insulating nitride may further prevent aggregation of the perovskite crystals by forming a dense matrix around the crystals.

The insulating oxide or nitride may be encapsulated within, for example, a polymer matrix of, for example, PMMA, polystyrene, polyimides, or other materials, which may be deposited as a layer on top of the device structure. Preferably, the material for the matrix for encapsulating the insulating oxide or nitride may be chosen such that the processing temperature for depositing the matrix onto the film comprising perovskite crystals may be below a threshold, and in particular below approximately 80° C. -100° C., above which the perovskite crystals may degrade.

As outlined above, the inventors have observed that the photoluminescence yield of non-encapsulated perovskite crystals decreases significantly during operation of the photoluminescent device. This is mainly observed when the photoluminescent device is being operated in air, as will be further described below. Exposure to oxygen and/or water, as well as a photo-induced degradation, have been determined to be the major causes of degradation of perovskite during operation of the photoluminescent device. Encapsulating the film comprising perovskite crystals with an insulating oxide or insulating nitride advantageously prevents the perovskite crystals from degrading during the photoluminescence process. By encapsulating the film comprising perovskite crystals with a layer or within a matrix of an insulating oxide or an insulating nitride using methods as described herein, the perovskite crystal-based film retains or even increases the photoluminescence yield compared to a substantially similar, pristine (i.e. prior to operation), non-encapsulated film comprising perovskite crystals, or compared to a substantially similar, non-encapsulated film comprising perovskite crystals when being operated in, for example, a nitrogen atmosphere.

Therefore, in a preferred embodiment of the photoluminescent device, a photoluminescence yield of the perovskite crystals is substantially the same or higher than a photoluminescence yield of substantially similar, pristine, non-encapsulated perovskite crystals.

The inventors have realised that the methods described herein may be applied to devices in which the perovskite crystal-based film comprises perovskite nanocrystals, in particular nanoparticles or perovskite nano-wires, more particularly perovskite quantum dots, perovskite quantum wires and/or perovskite quantum wells.

Therefore, in a preferred embodiment of the photoluminescent device, the perovskite crystals comprise perovskite nanocrystals, in particular perovskite nanoparticles or perovskite nano-wires, preferably perovskite quantum dots (for example colloidal perovskite quantum dots), perovskite quantum wires or perovskite quantum wells, and more preferably perovskite quantum dots. It will be understood that the film comprising perovskite crystals may consist solely of perovskite crystals (for example perovskite quantum dots, perovskite quantum wires, perovskite quantum wells, or more generally, perovskite nanoparticles or perovskite nano-wires). Alternatively, the film comprising perovskite crystals may consist of, for example, an organic-inorganic hybrid perovskite film, or a film in which the perovskite crystals are embedded within a matrix of another material which may be organic or inorganic.

Luminescent devices, in which perovskite quantum dots, perovskite quantum wires or perovskite quantum wells may be used may thereby provide, for example for brighter displays, improved lifetimes, and other advantages over lighting devices based on other technologies, such as LCDs or OLEDs. It is to be noted that methods and devices described herein may be applied to perovskite materials with different shapes and/or dimensions.

The perovskite-based film may comprise small crystallites of perovskite photoluminescent materials, which may be of varying sizes and shapes, with physical dimensions from nm scale to micron scale. This encompasses all commonly-used terms including, for example, perovskite nanoparticles, nano-wires, quantum dots, quantum wires, quantum wells, and others. In some embodiments, the crystallites have physical dimensions above the micron scale. References to a "nanocrystal" throughout the specification are to be understood as a crystal having at least one dimension smaller than approximately 100 nm or a few hundred nm.

In a further preferred embodiment of the photoluminescent device, the insulating oxide or insulating nitride is selected from aluminium oxide, silicon dioxide, titanium oxide, nickel oxide, magnesium oxide, zinc oxide, titanium nitride and silicon nitride. Preferably, the material for the insulating layer or matrix may be chosen such that a deposition temperature used for depositing the insulating layer or matrix does not exceed a temperature at which the perovskite crystals degrade, and in particular at which the photoluminescence yield of the perovskite crystals decreases. Therefore, in a preferred embodiment of the photoluminescent device, the insulating oxide is aluminium oxide. Aluminium oxide may be deposited onto the substrate using techniques, such as atomic layer deposition, which allow for deposition temperatures as low as, for example, 20° C., as will be further described below, thereby preventing a degradation of the perovskite crystals.

In a preferred embodiment of the photoluminescent device, the insulating oxide or insulating nitride layer or matrix encapsulating the film comprising perovskite crystals is from 5 to 1000 nm thick. An encapsulation layer or matrix with a thickness of at least approximately 5 nm may ensure a continuous encapsulation layer or matrix, which may be crucial to preventing the perovskite crystals from degradation. In a preferred embodiment, the insulating oxide or insulating nitride layer or matrix encapsulating the film comprising perovskite crystals is from 50 to 500 nm thick.

We note that the thickness of the insulating layer or matrix may, in some embodiments, be preferably more than 100 nm for phosphors, and it may in some embodiments preferably be less than 1 nm for LEDs.

In some preferred embodiments, the insulating oxide or insulating nitride layer is, as outlined above, less than 5 nm thick. As will be further described below, in embodiments of the luminescent device in which the insulating oxide or insulating nitride layer has a thickness in the sub-nanometre range, the insulating material may cross-link with ligands which may be present adjacent to the perovskite crystals, thus preventing solubility of the perovskite crystals. At the same time, the charge injection properties into the perovskite crystals via the insulating oxide or nitride may be unaffected by the presence of the insulating layer. As will be further described below, the thin insulating oxide or nitride may help passivate defects in the perovskite crystals. It will be appreciated that some of these advantages equally apply to insulating oxide or nitride layers which have a thickness of 1 nm or above.

In a preferred embodiment of the photoluminescent device, the insulating oxide or insulating nitride layer or matrix encapsulating the film comprising perovskite crystals is deposited by a vapour-based deposition method. Chemical processes occurring at the surface of the perovskite crystals may thereby result in particular in a high-quality interface between the perovskite crystal(s) and the insulating encapsulation layer or matrix, which may allow for retaining a high photoluminescence yield of the photoluminescent device during operation as well as preventing the perovskite crystals from other degradation mechanisms.

Using a vapour-based deposition method may further be advantageous over other techniques since a vapour-based deposition method is less (or not at all) directional, allowing for a complete coverage of the perovskite crystals (or the film comprising perovskite crystals) with an encapsulation layer or matrix. As outlined above, a complete coverage of the perovskite crystals with an encapsulation layer or matrix is crucial for maintaining a high photoluminescence yield of the device by preventing the perovskite from degradation.

In a preferred embodiment of the photoluminescent device, the vapour-based deposition method is selected from chemical vapour deposition, vacuum atomic layer deposition, and atmospheric atomic layer deposition, and more preferably atmospheric atomic layer deposition.

Atmospheric atomic layer deposition may be the preferred method for depositing the encapsulation layer or matrix as it ensures that a continuous layer or matrix is deposited onto the perovskite crystals. Furthermore, the encapsulation layer or matrix may be deposited at atmospheric pressure, making the use of vacuum pumps redundant.

In a preferred embodiment of the photoluminescent device, a photoluminescence yield of the photoluminescent device is at least 50%. As outlined above, such a high photoluminescent yield may be achieved and maintained during operation of the photoluminescent device due to the prevention of the perovskite crystals from degradation, while avoiding a decrease of the photoluminescence yield during deposition of the encapsulation layer or matrix. In preferred embodiments, the photoluminescence yield of the photoluminescent device is from 50-80%.

As outlined above, the perovskite crystal device may be protected from various degradation mechanisms. The perovskite crystals may, for example, be protected from exposure to water (and/or oxygen).

Therefore, in a preferred embodiment, the photoluminescent device retains at least 95% of its photoluminescence yield after exposing it to water (which may be deionized) at 20° C. for 1 minute. Experiments confirming this high degree of protection from water-based degradation will be further described below.

The inventors have further shown that the insulating oxide or nitride encapsulating the film comprising perovskite crystals results in an improved stability to thermal degradation compared to a non-encapsulated film.

Therefore, in a preferred embodiment, the film comprising perovskite crystals has improved stability to thermal degradation compared to an equivalent film comprising perovskite crystals which is not encapsulated with a layer or within a matrix of an insulating oxide or an insulating nitride. In a further preferred embodiment, the photoluminescent device is stable to thermal degradation up to 170° C. for at least 10 minutes in air.

In a preferred embodiment of the photoluminescent device, the perovskite crystals have a diameter of from 1 to 200 nm, preferably from 1 to 20 nm. As outlined above, the perovskite crystals may be perovskite quantum dots, and a diameter of the perovskite quantum dots of a few nm may result in a higher confinement, and thereby improved properties, for example higher photoluminescence yields, of the quantum dots. It is therefore generally desirable to synthesise perovskite crystals with physical dimensions which are as small as possible, and in particular below approximately 20 nm in diameter.

In a further preferred embodiment of the photoluminescent device, the perovskite crystals consist of an organometal halide perovskite or a metal-metal halide perovskite material.

In preferred embodiments, the organometal halide perovskite or metal-metal halide perovskite has an $AMX_3$ structure, where A is a monovalent cation, M is a divalent cation and X is a halide anion.

In a further preferred embodiment, the divalent cation M is a divalent metal cation. In embodiments, the divalent metal cation is tin ($Sn^{2+}$) or lead ($Pb^{2+}$).

In preferred embodiments, the monovalent cation is an alkali metal cation, in particular caesium ($Cs^+$). Alternatively, the monovalent cation may be rubidium ($Rb^+$).

In one preferred embodiments, the monovalent cation is a primary, secondary or tertiary ammonium cation $[HNR^1R^2R^3]^+$, wherein each of $R^1$, $R^2$ and $R^3$ is the same or is different and is selected from hydrogen, an unsubstituted or substituted $C_1$-$C_{20}$ alkyl group and an unsubstituted or substituted $C_5$-$C_{18}$ aryl group.

In another preferred embodiments, the monovalent cation is of the form $[R^1R^2N\text{---}CH\text{==}NR^3R^4]^+$:

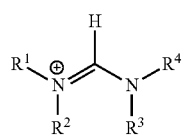

wherein each of $R^1$, $R^2$, $R^3$ and $R^4$ is the same or is different and is selected from hydrogen, an unsubstituted or substituted $C_1$-$C_{20}$ alkyl group and an unsubstituted or substituted $C_5$-$C_{18}$ aryl group.

In yet another preferred embodiments, the monovalent cation is of the form $(R^1R^2N)(R^3R^4N)C\text{==}NR^5R^6$:

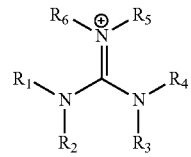

wherein each of $R^1$ $R^2$, $R^3$, $R^4$, $R^5$ and $R^6$ is the same or is different and is selected from hydrogen, an unsubstituted or substituted $C_1$-$C_{20}$ alkyl group and an unsubstituted or substituted $C_5$-$C_{18}$ aryl group.

In preferred embodiments, X is a halide anion selected from chloride, bromide, iodide, and fluoride and, in the $AMX_3$ structure each halide is the same or is different.

In preferred embodiments, the organometal halide perovskite material or metal-metal halide perovskite has an $A_{1-i}B_iMX_3$ structure, wherein: A and B are each a monovalent cation as described above, where A and B are different; M is a divalent metal cation as described above; X is a halide anion as described above; and i is between 0 and 1.

In preferred embodiments, the organometal halide perovskite or metal-metal halide perovskite material has an $AMX_{3-k}Y_k$ structure, wherein: A is a monovalent cation as described above; M is a divalent metal cation as described above; X and Y are each a halide anion as described above, where X and Y are different; and k is between 0 and 3.

In preferred embodiments, the organometal halide perovskite material or metal-metal halide perovskite has an $AM_{1-j}N_jX_3$ structure, wherein: A is a monovalent cation as described above; M and N are each a divalent metal cation as described above; X is a halide anion as described above; and j is between 0 and 1.

In preferred embodiments, the organometal halide perovskite material or metal-metal halide perovskite has an $A_{1-i}B_iM_{1-j}N_jX_{3-k}Y_k$ structure, wherein: A and B are each a monovalent cation as described above, where A and B are different; M and N are each a divalent metal cation as described above; X and Y are each a halide anion as described above, where X and Y are different; and where i is between 0 and 1, j is between 0 and 1, and k is between 0 and 3.

In a preferred embodiment of the photoluminescent device, the layer or matrix of an insulating oxide or an insulating nitride retains a mechanical flexibility of the film comprising perovskite crystals on the substrate. In other words, the mechanical flexibility of the encapsulated film comprising perovskite crystals is not worsened compared to a non-encapsulated, substantially similar perovskite crystal-based film.

This may be particularly useful when the encapsulated film comprising perovskite crystals is exploited in a flexible device, for example a flexible display, whereby retaining the mechanical flexibility of the device is crucial.

In a related aspect of the invention, there is provided a method of manufacturing a photoluminescent device, the method comprising: providing a substrate; depositing a film comprising perovskite crystals on the substrate; and depositing on the film comprising perovskite crystals an encapsulating layer or matrix of an insulating oxide or an insulating nitride, the method being such that the photoluminescence yield of the perovskite crystals is substantially unchanged as a result of the final step of depositing the encapsulating layer or matrix of an insulating oxide or an insulating nitride on the film comprising perovskite crystals.

As outlined above, preferably, the insulating oxide or insulating nitride is deposited onto the film comprising perovskite crystals from precursors for the insulating material using a vapour-based deposition technique. This may ensure that no defects are introduced into the perovskite crystals, which may allow for ensuring that the photoluminescence yield of the perovskite crystals is substantially unchanged as a result of the deposition of the encapsulation layer or matrix on the film comprising perovskite crystals.

Preferably, the film comprising perovskite crystals is deposited onto the substrate from a colloidal preparation of perovskite nanocrystals. Alternatively, the film comprising perovskite crystals may be deposited using a vacuum deposition technique.

In a preferred embodiment of the method, the colloidal preparation of perovskite nanocrystals is prepared from precursors for the perovskite.

In a further preferred embodiment of the method, the encapsulating layer or matrix of an insulating oxide or an insulating nitride is deposited on the film comprising perovskite crystals by a thin-film deposition method selected from chemical vapour deposition, vacuum atomic layer deposition and atmospheric atomic layer deposition. Preferably, the insulating oxide or insulating nitride layer or matrix encapsulating the film comprising perovskite crystals is deposited by atmospheric atomic layer deposition, as outlined above.

In preferred embodiments, the insulating oxide and precursors therefor are selected from: aluminium oxide, where the precursors are trimethylaluminium (TMA), water and oxygen; silicon dioxide, where the precursors are tetraethoxysilane and ammonia; titanium oxide, were the precursors are titanium tetrachloride and water; and zinc oxide, where the precursors are diethylzinc and water.

In a preferred embodiment, the layer or matrix of the insulating oxide or insulating nitride is deposited on the film comprising perovskite crystals at a temperature of from 20-100° C., preferably from 20-80° C. As outlined above, this ensures that the perovskite crystals do not degrade during the deposition of the encapsulation layer or matrix. It will be understood that, preferably, the encapsulation layer or matrix is deposited at room temperature (i.e. around 20° C.), while ensuring that the encapsulation forms a continuous film or matrix.

In a preferred embodiment, the layer or matrix of the insulating oxide or insulating nitride is deposited on the film comprising perovskite crystals at a thickness of from 5 to 1000 nm, in particular from 50 to 500 nm, more preferably less than 5 nm, more preferably less than 1 nm. As outlined above, this ensures that the film comprising perovskite crystals is completely covered by the encapsulation layer or matrix.

In a preferred embodiment, the film comprising perovskite crystals is deposited on the substrate by spin coating. This may be preferable since spin-coating is a relatively cheap technique for depositing the film comprising perovskite crystals compared to, for example, vacuum-based deposition techniques.

In a preferred embodiment of the method, the perovskite crystals consist of perovskite as described above.

In a related aspect of the invention, there is provided a light-emissive device prepared using embodiments of the method described herein.

In a further related aspect of the invention, there is provided an electronic device, wherein a display of the electronic device comprises a luminescent device as described herein.

In a related aspect of the invention, there is provided a luminescent device comprising a substrate and a film comprising perovskite crystals deposited on the substrate, wherein the film comprising perovskite crystals is encapsulated with an insulating layer or network comprising a metal oxide and a metal hydroxide.

The device may be excited by photoabsorption to give a photoluminescent device, or by electrical excitation, further requiring electrical connections above and below the perovskite crystal layer, to give an electroluminescent device, or light-emitting diode.

Preferred embodiments outlined above with regard to the photoluminescent device are equally applicable to the luminescent device, which may, in some embodiments, be an electroluminescent device.

In some embodiments, the insulating layer or network may have a thickness of less than 5 nm, preferably less than 1 nm.

As will be further described below, the thin insulating layer or network may cross-link with ligands adjacent the perovskite crystals, thereby advantageously preventing solubility of the perovskite crystals.

The inventors have also realised that the thin insulating layer or network comprising a metal oxide and a metal hydroxide may provide for high charge injection efficiency into the perovskite crystals, allowing operation as a light-emitting diode and further advantageously helps passivate defects in the perovskite crystals.

In a preferred embodiment of the luminescent device, the metal oxide comprises aluminium oxide and the metal hydroxide comprises aluminium hydroxide. The aluminium oxide/aluminium hydroxide network may be prepared using a vapour-based cross-linking method which results in the above-specified advantages the insulating layer or network provides.

In a further preferred embodiment of the luminescent device, the metal oxide and metal hydroxide covalently bond to ligands attached to the perovskite crystals. This may advantageously provide for a layer or network which bonds particularly strongly to the ligands adjacent the perovskite crystals, thereby enhancing insolubility of the perovskite crystals (for example to those solvents known to the skilled person which may generally be used to dissolve perovskite crystals) and/or particularly passivating defects in the perovskite crystals.

In a further related aspect of the invention, there is provided a method for preparing a luminescent device, the method comprising: providing a substrate; depositing a film comprising perovskite crystals onto said substrate; and encapsulating said perovskite crystals with an insulating layer or network comprising a metal oxide and a metal hydroxide.

As outlined above, the insulating layer or network comprising a metal oxide and a metal hydroxide may advantageously passivate surface defects of the perovskite crystals and prevent solubility of the perovskite crystals.

In a preferred embodiment of the method, the encapsulating comprises exposing the perovskite crystals to a precursor (or precursor vapour) for the insulating layer or network and subsequently exposing the perovskite crystals to moisture to hydrolyse a material of the precursor to form the insulating layer or network. This vapour-based treatment of the perovskite crystals to encapsulate the perovskite crystals with a layer or network comprising a metal oxide and a metal hydroxide may be particularly preferable as it may allow for guaranteeing a continuous network of the encapsulating insulator. This may advantageously ensure insolubility of the perovskite crystals. A vapour-based deposition technique may be particularly preferable over, e.g. a solution-based method, as the vapour-based method advantageously allows for preserving the nanocrystal arrangement from the starting perovskite crystal film. A vapour-based method furthermore may allow for depositing a very thin (e.g. less than 1 nm in embodiments) oxide (or oxide/hydroxide) network or layer uniformly over the entire perovskite crystal film. Further still, a solution-based cross-linking may not preserve a luminescent (e.g. photoluminescent) yield, in contrast to the vapour-based method described herein.

In a preferred embodiment of the method, the precursor reacts with ligands attached to the perovskite crystals as a result of the exposure of the perovskite crystals to the precursor (or precursor vapour). This may allow for obtaining a dense network of the metal oxide and metal hydroxide and may therefore enhance insolubility of the perovskite crystals and particularly help eliminate surface defects in the perovskite crystal film.

In a preferred embodiment of the method, the metal oxide comprises aluminium oxide and the metal hydroxide comprises aluminium hydroxide. These materials may be particularly suitable to bond to the ligands attached to the perovskite crystals, resulting in the improved properties of the device with regard to insolubility of the perovskite crystals and elimination of surface defects of the crystals.

The perovskite crystals may, in some preferred embodiments, be perovskite nanocrystals which may be semiconducting, conducting or, in some embodiments, insulating. The nanocrystals may, in some embodiments, be nanoparticles or perovskite nano-wires, more particularly perovskite quantum dots, perovskite quantum wires and/or perovskite quantum wells.

In a further preferred embodiment of the method, the precursor comprises trimethylaluminium which reacts with carboxylate and/or amino groups of the ligands attached to the perovskite crystals as a result of the exposure of the perovskite crystals to the trimethylaluminium precursor. The inventors have observed that the ligands may be completely cross-linked upon trimethylaluminium treatment, confirming that the ligands may be chemically incorporated into the aluminium oxide-aluminium hydroxide network.

Preferably, the metal oxide and/or metal hydroxide are configured to passivate surface defects in the film comprising perovskite crystals to enhance a luminescent yield of the perovskite crystals.

Preferred embodiments outlined above with regard to the luminescent device comprising a substrate and a film comprising perovskite crystals deposited on the substrate, wherein the film comprising perovskite crystals is encapsulated with a layer or within a matrix of an insulating oxide or an insulating nitride, equally apply to methods and devices in which the perovskite crystals are encapsulated with a layer or network comprising a metal oxide and a metal hydroxide. For example, the network comprising aluminium oxide and aluminium hydroxide which, due to the cross-linking, prevents solubility of the perovskite crystals, which has good charge injection properties into the perovskite crystals and which helps passivate defects in the perovskite crystals, may be achieved with an encapsulating layer or network with a thickness of, for example, less than 5 nm, in particular less than 1 nm. Such embodiments allow use both as an optically-excited photoluminescent device and also as an electrically-excited photoluminescent device, i.e. as a light-emitting diode.

Furthermore, the perovskite crystal-based film may comprise perovskite nanocrystals, in particular nanoparticles or perovskite nano-wires, more particularly perovskite quantum dots, perovskite quantum wires and/or perovskite quantum wells.

The insulating layer or network may be prepared using, for example, atomic layer deposition, in particular atmospheric atomic layer deposition.

As will be further described below, the method may allow for enhancement of the luminescent yield of the luminescent device, and the luminescent yield may not decrease upon deposition of the layer or network comprising the metal oxide and metal hydroxide onto the perovskite crystals.

The vapour-based technique described herein may make the use of ligand exchange processes redundant. The method described herein therefore advantageously allows cross-linking the perovskite crystals without altering the original crystal arrangement, thereby allowing much of the original structural and electronics properties of the perovskite crystal film to be preserved.

BRIEF DESCRIPTION OF THE DRAWINGS

Embodiments of the present invention will now be described, by way of example, with reference to the accompanying drawings, wherein like numerals refer to like parts throughout, and in which:

FIG. 3 shows photoluminescence efficiency of photoluminescent devices prepared according to embodiments of the present invention and the prior art;

FIG. 4 shows photoluminescence efficiency of photoluminescent devices prepared according to embodiments of the present invention and the prior art;

DETAILED DESCRIPTION OF THE PREFERRED EMBODIMENTS

Figure 1A:
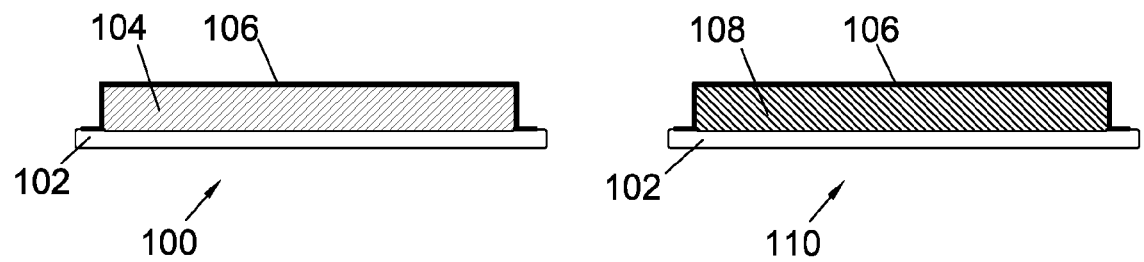
FIG. 1 shows schematic, cross-sectional side views of photoluminescent devices according to embodiments of the present invention.

In the following examples, the film comprising perovskite crystals consists solely of perovskite. We note that references throughout the specification to a film comprising perovskite crystals consisting solely of perovskite include, inter alia, pure perovskite crystal films as well as perovskite crystal films in which ligands bind to the perovskite crystals. These ligands may be used during synthesis of the perovskite crystals, in particular to avoid agglomeration of perovskite crystals during synthesis, as will be known to those skilled in the art. These ligands may be organic ligands. In the examples described herein, the ligands used for synthesising the perovskite crystals are oleylamine or oleic acid.

In some examples, the above-described vapour-based cross-linking method may be used to covalently bind the precursor material from which the insulating encapsulation layer, matrix or network is formed to the ligands which are used during synthesis of the perovskite crystals.

In this example, perovskite nanoparticles are encapsulated with a layer or within a matrix of insulating material. The insulating material may be, but is not limited to, silica, titania, zinc oxide, or, preferably, alumina.

In this example, a vapour-based deposition technique which uses the vapour precursors of the material to be deposited is exploited, which relies upon the sequential reaction of these precursors with the surface of the perovskite nanoparticles, or alternatively relies upon the reaction between the precursors, to obtain a protective matrix or layer of insulating material on top of or around the perovskite nanoparticles.

When alumina is used as the insulating material, the precursors may be, but are not limited to, trimethylaluminium, water and oxygen. When silica is used as the insulating material, the precursors may be, but are not limited to, tetraethoxysilane and ammonia. When titanium oxide is used as the insulating material, the precursors may be, but are not limited to, titanium tetrachloride and water. When zinc oxide is used as the insulating material, the precursors may be, but are not limited to, diethylzinc and water.

As outlined above, the vapour-based deposition technique may be, for example, atmospheric atomic layer deposition (also known as atmospheric pressure spatial atomic layer deposition), vacuum atomic layer deposition, or chemical vapour deposition.

Alternative thin-film deposition techniques, such as, for example, sputtering, e-beam evaporation, thermal evaporation, and others, may be used, though, as outlined above, vapour-based deposition techniques may be preferred as they are not directional and therefore ensure a complete coverage of the perovskite material.

The vapour-based deposition technique may be performed at a temperature which is preferably lower than 100° C. so that the perovskite does not degrade during deposition of the encapsulation layer or matrix.

In this example, encapsulation layers are deposited, inter alia, at room temperature (i.e. approximately 20° C.). The method may allow for preventing damage being caused to the underlying layer of perovskite nanoparticles, and may offer high quality encapsulation and protection of the perovskite nanoparticles against degradation while retaining a high photoluminescence yield of the perovskite nanoparticles.

As outlined above, typically, a reactive vapour-based deposition technique is expected to cause some level of damage to luminescent nanoparticle materials by introducing defects which quenches emission. However, surprisingly, no evidence of such damage is observed in the present perovskite nanoparticles upon deposition of the protective insulating materials as described herein.

As will be further described below, the insulating matrix or layer may protect the perovskite nanoparticles against photo-induced degradation in air. Furthermore, the insulating matrix or layer advantageously protects the perovskite nanoparticles against water and humidity. The encapsulation layer or matrix further advantageously protects the perovskite nanoparticles against thermal degradation. Additionally, the perovskite nanoparticles with insulating matrix or layer may be used as an emissive phosphor to efficiently down-convert higher energy photons (short wavelength) to lower energy photons (longer wavelength).

FIG. 1a shows schematic, cross-sectional side views of photoluminescent devices 100 and 110 as described above.

Photoluminescent device 100 comprises a substrate 102 onto which a green-emitting perovskite nanocrystal film 104 is deposited. In this example, the green-emitting perovskite nanocrystal film 104 is deposited onto the substrate 102 by spin-coating the quantum dot in ambient condition in air onto the substrate 102.

In this example, the substrate 102 is a glass substrate 102, though other substrates, which may be transparent (or translucent), opaque, or non-transparent, organic or inorganic, may be used.

The green-emitting perovskite nanocrystal film 104 is, in this example, covered by an aluminium oxide encapsulation layer 106, which is deposited on top of the green-emitting perovskite nanocrystal film 104 by atmospheric atomic layer deposition.

In this work, the number of cycles for the atmospheric atomic layer deposition of the encapsulation layer is varied, showing the effects of the encapsulation layer on the perovskite quantum dot for different thicknesses of the encapsulation layer.

Similar to the above-described photoluminescent device 100, photoluminescent device 110 comprises a substrate 102, a red-emitting perovskite nanocrystal film 108 encapsulated, in this example, with an aluminium oxide encapsulation layer 106.

Figure 1B:
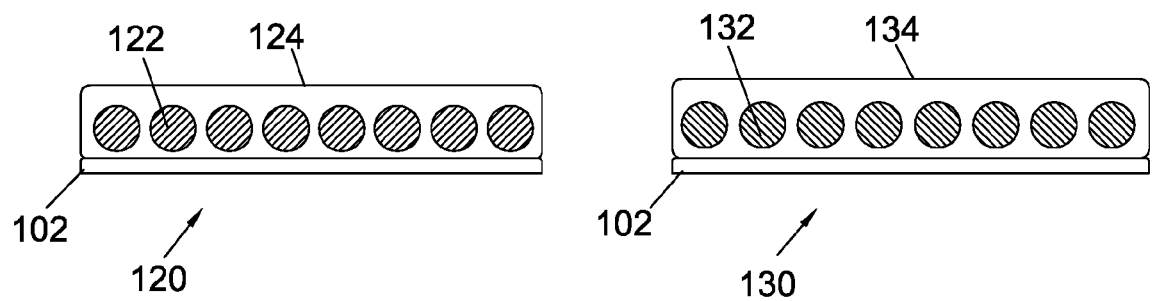

FIG. 1b shows further schematic, cross-sectional side views of photoluminescent devices 120 and 130 as described above.

Photoluminescent device 120 comprises a substrate 102 onto which green-emitting perovskite nanocrystals 122 (e.g. quantum dots) are deposited. The green-emitting perovskite nanocrystals 122 are, in this example, encapsulated within an aluminium oxide matrix 124.

Similar to the photoluminescent device 120, photoluminescent device 130 comprises a substrate 102 onto which red-emitting perovskite nanocrystals 132 (e.g. quantum dots) are deposited. The red-emitting perovskite nanocrystals 132 are, in this example, encapsulated within an aluminium oxide matrix 134.

In these examples, $CsPbBr_3$ and $CsPb(Br_{1-x}I_x)_3$ nanoparticles are synthesized by the method reported in L. Protesescu et al., Nano Lett. 2015, 15 (6), 3692-3696, at 170° C. The nanocrystals are precipitated by butanol and re-dissolved by hexane twice to get rid of excessive ligands.

In the examples of FIG. 1, perovskite nanoparticles thin films are deposited on transparent substrates by spin coating of $CsPbBr_3$ and $CsPb(Br_{1-x}I_x)_3$ (where $0 \leq x \leq 1$) as green or red emitting materials, respectively. The solution of nanoparticles is prepared in hexane with concentrations in the range of 20-60 mg/ml and spin-coated under ambient conditions in air.

Following the nanoparticle film preparation, the nanoparticles are protected with alumina, using an atmospheric atomic layer deposition (AALD) method (also known as atmospheric pressure spatial atomic layer deposition).

Figure 2:
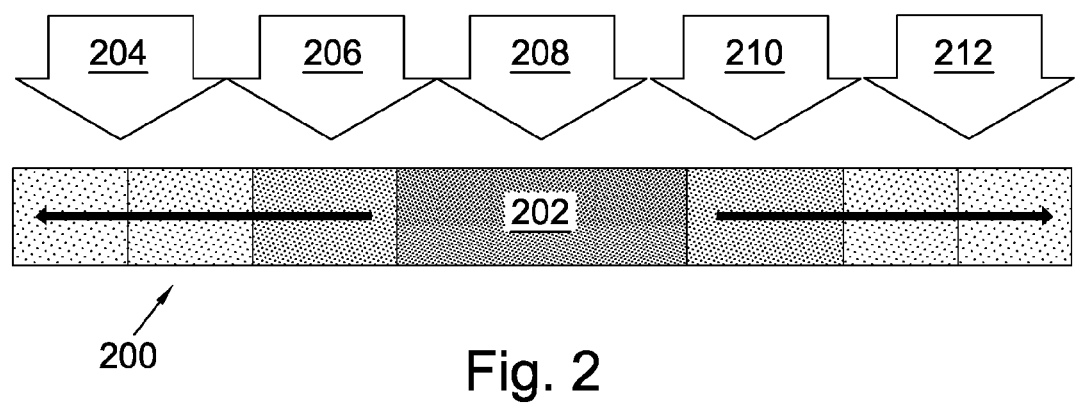
FIG. 2 shows a schematic of atomic layer deposition steps according to embodiments of the present invention.

FIG. 2 shows a schematic 200 of atomic layer deposition steps used to prepare the insulating encapsulation layer 106 and the insulating, encapsulating matrices 124 and 134 displayed in FIG. 1.

In this example, aluminium oxide is deposited using trimethylaluminium (TMA) and water as precursors.

Similar to a printing technique, precursor gases (at locations 206 and 210) and inert nitrogen (at locations 204, 208 and 212) are ejected from adjacent channels, and the substrate 202 moves back and forth (oscillates) horizontally under the deposition head, as shown in FIG. 2.

An inert gas ($N_2$) is, in this example, separately bubbled through the liquid TMA and $H_2O$ precursors to form the precursor gases.

The precursor flow rates are, in this example, as follows:

Flow rate of $N_2$ in the TMA bubbler: 20 mL/min (the possible range of operation is, in this example, 10-50 mL/min), further diluted by 200 mL/min $N_2$ (possible range in this example: 100-1000 mL/min);

Flow rate of $N_2$ in the $H_2O$ bubbler: 40 mL/min (possible range in this example: 20-100 mL/min), further diluted by 200 mL/min $N_2$ (possible range in this example: 100-1000 mL/min);

Inert gas ($N_2$) channel flow rate: 800 mL/min (possible range in this example: 200-2000 mL/min).

Other atomic layer deposition setups may be used, wherein the different gases and precursors are sequentially introduced into the sample chamber.

The substrate temperature is, in this example, 80° C. (possible range of operation in this example: room temperature (~20° C.)-300° C.). The deposition head to sample surface distance is in this example 75-80 μm (the possible range is, in this example, 50-500 μm). The relative speed of the substrate 202 to the deposition head may be varied, for example between 10 mm/s and 100 mm/s, in this example 50 mm/s.

This printing process is repeated in multiple cycles until the desired deposition thickness is achieved. In this example, each deposition (printing) cycle of the substrate motion (oscillation) provides a 2 nm layer of aluminium oxide.

The AALD-deposited aluminium oxide may offer effective protection of the perovskite nanoparticles against photo-degradation in air. Typically, the absorption of light excites a ground state electron and creates an exciton in the semiconductor nanoparticle. The photo-excited nanoparticle can react with oxygen or water vapour in air, which creates defects in the nanoparticle. These defects cause luminescence quenching. This degradation process may be prevented by encapsulating the nanoparticles in an inert material, in this case, a layer or a matrix of alumina ($Al_2O_3$).

In examples of the low-temperature atomic layer deposition method used here to encapsulate perovskite nanoparticles, a 10 mg/ml solution of $CsPbBr_3$ nanoparticles in hexane is spin-coated in air on glass substrates at a speed of 2000 rpm and dried for a few minutes before atomic layer deposition.

Aluminium oxide is, in some examples, coated using a Beneq TFS 200 system. In this system, the sample(s) is (are) exposed sequentially to precursors in a vacuum chamber. Trimethylaluminium (TMA) and water are used a reactive precursors. The deposition temperature is 18+−1° C. The reactor pressure is below 3 mbar.

The deposition is run by repeating cycles of: TMA vapour injection for 250 ms, wait time for 2 s, water vapour injection for 200 ms, and wait time for 4 s.

The thickness of the ALD-deposited aluminium oxide is measured using atomic force microscopy.

In the examples described herein, perovskite nanoparticle samples are encapsulated with different thicknesses of alumina, and are illuminated with a high intensity (~50 mW/mm$^2$) 405 nm laser for ~1 minute in air before measuring their photoluminescence quantum efficiency (PLQE).

In the green-emitting $CsPbBr_3$ perovskite sample, an alumina layer with a thickness above 100 nm may offer protection against photo-degradation, and may retain a high photoluminescence quantum efficiency of ~70% in the perovskite nanoparticles. In comparison, the unprotected perovskite nanoparticles degrade under illumination, and display a much reduced photoluminescence quantum efficiency of 17%.

In the red-emitting $CsPb(Br_{1-x}I_x)_3$ perovskite sample, a high photoluminescence quantum efficiency of 60% is measured in the sample which is protected with 200 nm of alumina, while the unprotected sample degrades significantly under illumination, giving a photoluminescence quantum efficiency of less than 1%.

FIG. 3a shows photoluminescence efficiency of green-emitting perovskite ($CsPbBr_3$) nanoparticles. The photoluminescence is hereby shown as a function of wavelength for samples with green-emitting perovskite ($CsPbBr_3$) nanoparticles having aluminium oxide encapsulation layers with different thicknesses.

In this example, the thickness of the aluminium oxide encapsulation layer is varied between 0 nm (no encapsulation layer is used) and 240 nm.

As can be seen in FIG. 3a, the photoluminescence of the non-encapsulated green-emitting perovskite ($CsPbBr_3$) nanoparticles decreases significantly during operation of the photoluminescent device compared to samples which are encapsulated with an aluminium oxide encapsulation layer. The highest photoluminescence is observed, in this example, for green-emitting perovskite ($CsPbBr_3$) nanoparticles which are encapsulated with a 240 nm thick aluminium oxide encapsulation layer.

FIG. 3b shows photoluminescence quantum efficiency as a function of the aluminium oxide thickness for the measurements shown in FIG. 3a. FIG. 3c shows the result of the analysis.

As can be seen from FIGS. 3b and c, the photoluminescence quantum efficiency of the green-emitting perovskite ($CsPbBr_3$) nanoparticles decreases to 16.6% for the device which is not encapsulated. A larger photoluminescence quantum efficiency of 22.1% is observed for the device which is encapsulated with a 40 nm thin aluminium oxide encapsulation layer. Photoluminescence quantum efficiencies of around 70% and higher are obtained for green-emitting perovskite ($CsPbBr_3$) nanoparticles which are encapsulated with aluminium oxide encapsulation layers with a thickness of between 100 nm and 240 nm, the latter showing a photoluminescence quantum efficiency of 73.7%.

This result shows that a high photoluminescence yield may be obtained by encapsulating green-emitting perovskite ($CsPbBr_3$) nanoparticles with an aluminium oxide layer deposited on top of the perovskite ($CsPbBr_3$) nanoparticles by atmospheric atomic layer deposition.

The above-described experiment on green-emitting perovskite ($CsPbBr_3$) nanoparticles is also performed using red-emitting perovskite ($CsPb(Br_{1-x}I_x)_3$) nanoparticles.

FIG. 4a shows photoluminescence efficiency of red-emitting perovskite ($CsPb(Br_{1-x}I_x)_3$) nanoparticles. The photoluminescence is hereby shown as a function of wavelength for samples with red-emitting perovskite ($CsPb(Br_{1-x}I_x)_3$) nanoparticles having aluminium oxide encapsulation layers with different thicknesses.

In this example, the thickness of the aluminium oxide encapsulation layer is varied between 0 nm (no encapsulation layer is used) and 200 nm.

As can be seen in FIG. 4a, the photoluminescence of the non-encapsulated red-emitting perovskite ($CsPb(Br_{1-x}I_x)_3$) nanoparticles decreases significantly during operation of the photoluminescent device compared to samples which are encapsulated with an aluminium oxide encapsulation layer. The highest photoluminescence is observed, in this example, for red-emitting perovskite ($CsPb(Br_{1-x}I_x)_3$) nanoparticles which are encapsulated with a 200 nm thick aluminium oxide encapsulation layer.

FIG. 4b shows photoluminescence quantum efficiency as a function of the aluminium oxide thickness for the measurements shown in FIG. 4a. FIG. 4c shows the result of the analysis.

As can be seen from FIGS. 4b and c, the photoluminescence quantum efficiency of the red-emitting perovskite ($CsPb(Br_{1-x}I_x)_3$) nanoparticles decreases to 0.8% for the device which is not encapsulated. A larger photoluminescence quantum efficiency of 1.5% is observed for the device which is encapsulated with a 40 nm thin aluminium oxide encapsulation layer. A photoluminescence quantum efficiency of 59.6% is obtained for red-emitting perovskite ($CsPb(Br_{1-x}I_x)_3$) nanoparticles which are encapsulated with aluminium oxide encapsulation layers with a thickness of 200 nm.

This result shows that a high photoluminescence yield may be obtained by encapsulating red-emitting perovskite ($CsPb(Br_{1-x}I_x)_3$) nanoparticles with an aluminium oxide layer deposited on top of the perovskite ($CsPbBr_3$) nanoparticles by atmospheric atomic layer deposition.

FIG. 5 shows photoluminescence quantum efficiency of alumina-coated perovskite films prepared using, in this example, vacuum atomic layer deposition at low temperatures (approximately 20° C.). The photoluminescence quantum efficiency is plotted against the number of ALD deposition cycles.

The $PbBr_3$ samples with different thicknesses of alumina protection are illuminated with a blue (405 nm) laser for one minute, and their photoluminescence quantum efficiency (PLQE) is measured as a test for material degradation.

Figure 5A:
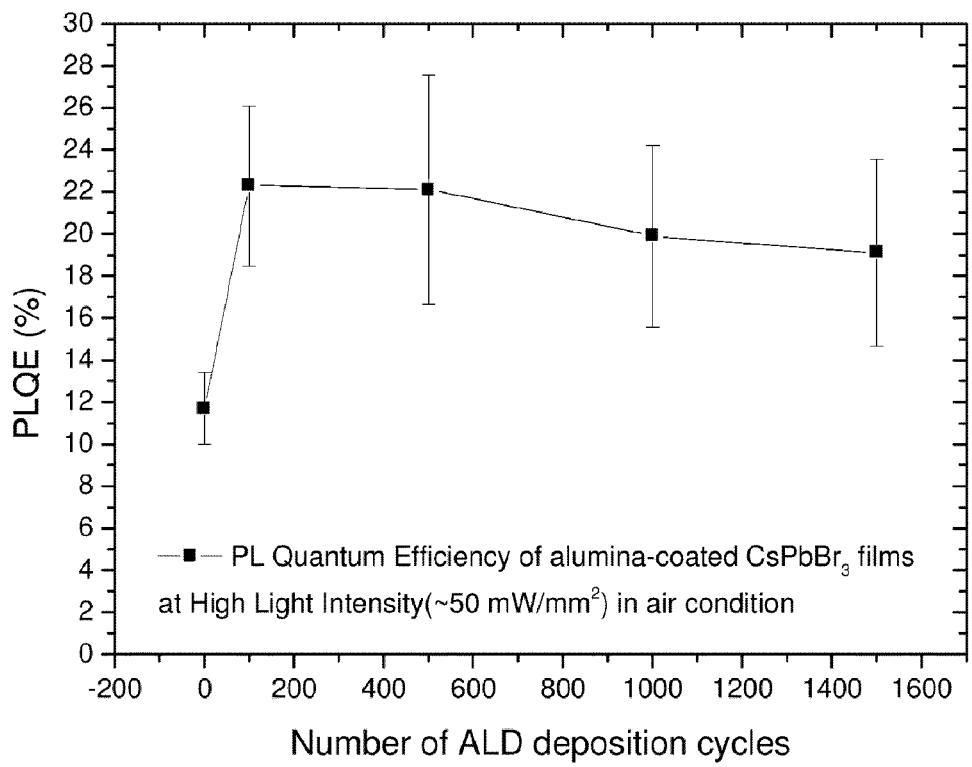
FIG. 5 shows photoluminescence quantum efficiency of alumina-coated perovskite films prepared according to embodiments of the present invention and the prior art.
Figure 5B:
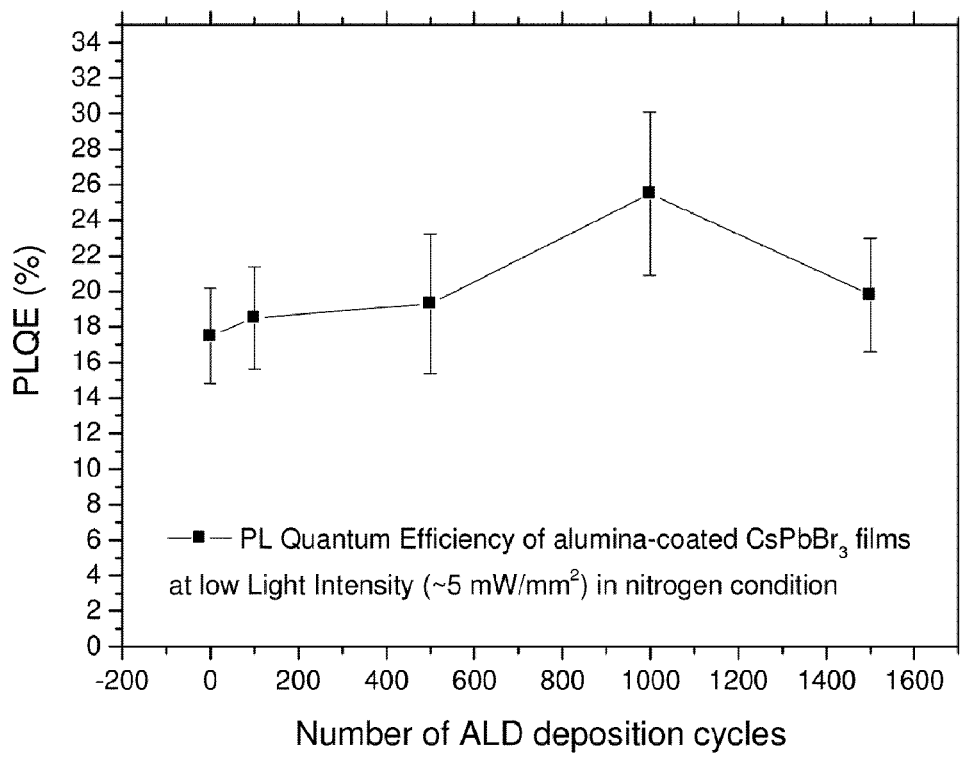

The photo-degradation experiments are performed in air (FIG. 5a) and in a nitrogen atmosphere (FIG. 5b).

In the measurements shown in FIG. 5a, the photoluminescence quantum efficiency is measured in air at a high light intensity of approximately 50 mW/mm$^2$.

As can be seen in FIG. 5a, the unprotected $PbBr_3$ nanoparticles photo-degrade in air, displaying a photoluminescence quantum efficiency of approximately 11.7%, which is only about half of their original photoluminescence quantum efficiency. $PbBr_3$ nanoparticles which are encapsulated with aluminium oxide deposited by atomic layer deposition as outlined above exhibit photoluminescence quantum efficiencies between 19% and 22%.

The result displayed in FIG. 5a shows that the aluminium oxide encapsulation layer in these examples offers a good protection against photo-degradation, and the nanoparticles retain their full photoluminescence quantum efficiency. This is achieved, in these examples, with an aluminium oxide encapsulation layer with a thickness of only approximately 6 nm.

FIG. 5b shows a control experiment, in which a set of similarly prepared perovskite nanoparticle samples are tested for photo-degradation in an inert nitrogen environment. The photoluminescence quantum efficiency is measured, in this example, in a nitrogen atmosphere at a low light intensity of approximately 5 mW/mm$^2$.

In this experiment, the photoluminescence quantum efficiency is similar across all devices, regardless of whether they are encapsulated with an ALD-deposited aluminium oxide encapsulation layer.

This result shows that the perovskite nanoparticles only degrade when illuminated in air (which contains oxygen and moisture), and that the aluminium oxide serves to encapsulate and separate the perovskite nanoparticles from a chemically reactive environment.

FIG. 6 shows water and humidity protection of perovskite nanoparticles prepared as described herein.

Generally, perovskite nanoparticles are sensitive to moisture and are partially soluble in water. To test the effectiveness of the aluminium oxide encapsulation layer deposited using atomic layer deposition in protecting the perovskite nanoparticles against water, a 240 nm layer of aluminium oxide is deposited on a film of perovskite nanoparticles. The sample is completely immersed and washed under running water for one minute. The sample is tested for its photoluminescence before and after water exposure.

Figure 6A:
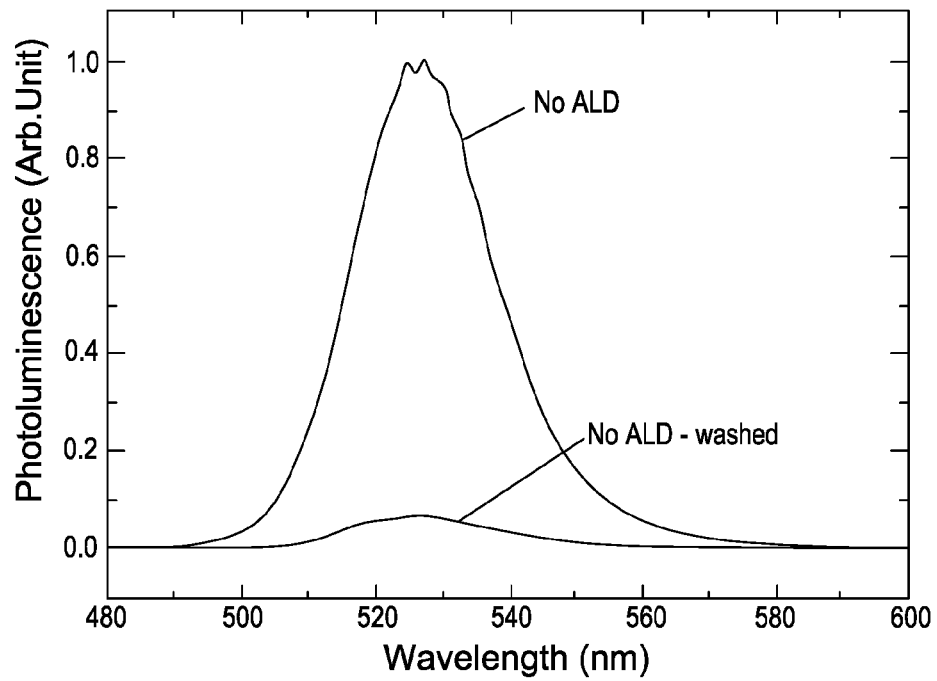
FIG. 6 shows water and humidity protection of perovskite nanoparticles prepared according to embodiments of the present invention and the prior art.

FIG. 6*a* shows photoluminescence as a function of wavelength for a non-encapsulated perovskite nanoparticle film. As can be seen, the photoluminescence of unprotected perovskite nanoparticles is almost completely lost after the running water treatment.

Figure 6B:
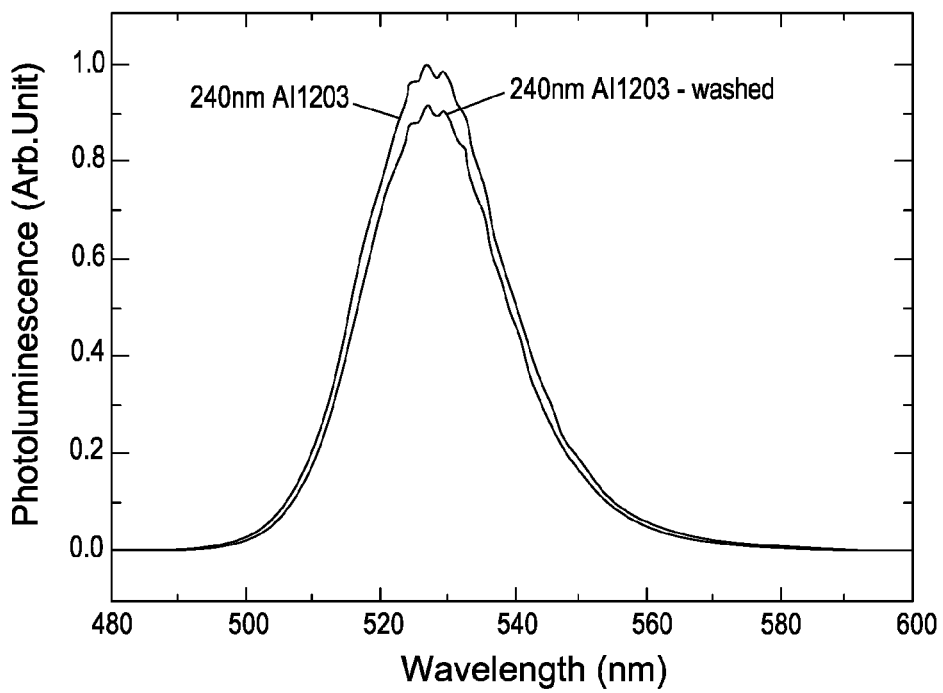

FIG. 6*b* shows photoluminescence as a function of wavelength for the perovskite nanoparticle film which is encapsulated with the 240 nm thick aluminium oxide encapsulation layer. As can be seen, the encapsulated perovskite nanoparticle film is barely affected by the water exposure. The photoluminescence of the perovskite nanoparticles is essentially the same before and after the water exposure within the margin of error.

FIG. 7 shows photoluminescence of heat-treated alumina-protected perovskite nanoparticles prepared as described herein.

Generally, perovskite nanoparticles are particularly sensitive to thermal heating. Typically, heating perovskite materials above 50° C. accelerates a mass diffusion process, which can lead to several effects: volatile components of the perovskite may sublime into the environment, resulting in material decomposition; mass may be transferred between perovskite nanoparticles, causing the growth of particle size and a loss of quantum confinement effect; mass transfer may lead to the formation of defects within the perovskite material, which quenches luminescence. Higher temperatures may also accelerate reaction of the perovskite with ambient oxygen and moisture to cause degradation.

Figure 7A:
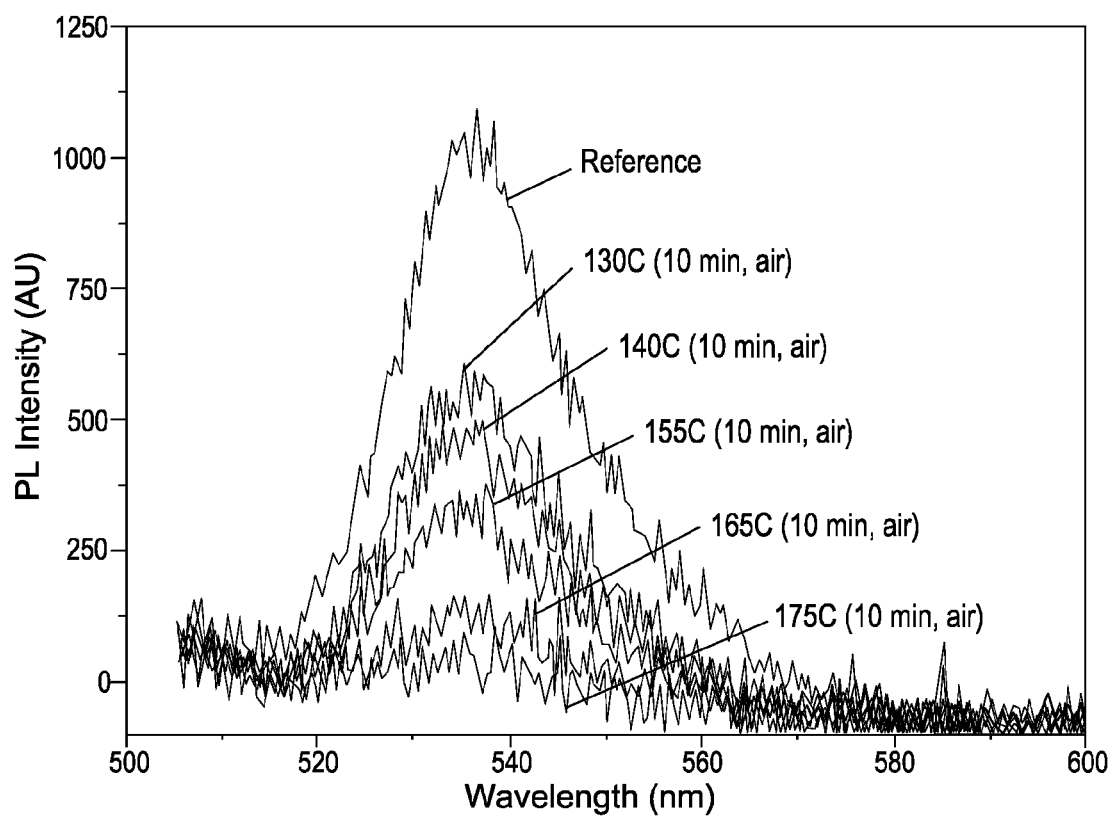
FIG. 7 shows photoluminescence of heat-treated alumina-protected perovskite nanoparticles prepared according to embodiments of the present invention and the prior art.

In this example, a thermal degradation test is performed, in which aluminium oxide protected perovskite nanoparticle samples and unprotected perovskite control samples are heat-treated for 10 minutes in air at temperatures ranging from 130° C. to 175° C. prior to taking photoluminescence measurements. The result is shown in FIG. 7*a*.

It can be seen that the alumina encapsulated samples show little degradation at temperatures of up to approximately 170° C., while the unprotected perovskite control sample turns nearly completely non-luminescent at approximately 130° C. (see FIGS. 7*c* and *d*).

Figure 7B:
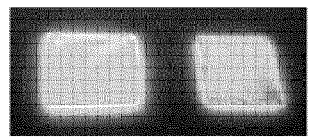

FIG. 7*b* shows optical images of photoluminescent unprotected perovskite (left) and a perovskite film encapsulated with alumina deposited using 20 cycles of atmospheric ALD. The images are obtained prior to heating the samples.

Figure 7C:
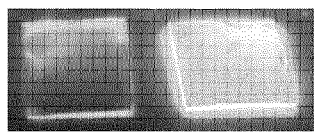

In FIG. 7*c*, the samples were thermally treated at 130° C. for 10 minutes in air. As can be seen, the photoluminescence of the non-encapsulated sample decreases significantly, while that of the alumina encapsulated sample is maintained.

Figure 7D:
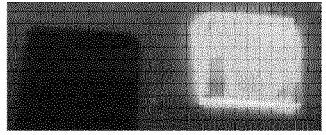

In FIG. 7*d*, the samples were thermally treated at 140° C. for 10 minutes in air. As can be seen, the photoluminescence of the non-encapsulated sample vanishes, while that of the alumina encapsulated sample is essentially maintained.

Figure 7E:
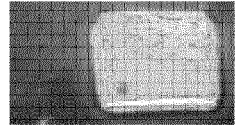

In FIG. 7*e*, the encapsulated sample was thermally treated at 155° C. for 10 minutes in air. As can be seen, the photoluminescence of the alumina encapsulated sample is essentially maintained.

Figure 7F:

In FIG. 7*f*, the encapsulated sample was thermally treated at 165° C. for 10 minutes in air. As can be seen, the photoluminescence of the alumina encapsulated sample decreases only slightly.

Figure 7G:
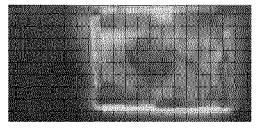

In FIG. 7*g*, the encapsulated sample was thermally treated at 175° C. for 10 minutes in air. A significant decrease of the photoluminescence is observed.

The above results show that the encapsulated perovskite nanoparticle film shows very little to no degradation when heat-treated, in this example, to approximately 165° C. for 10 minutes in air.

Figure 8:
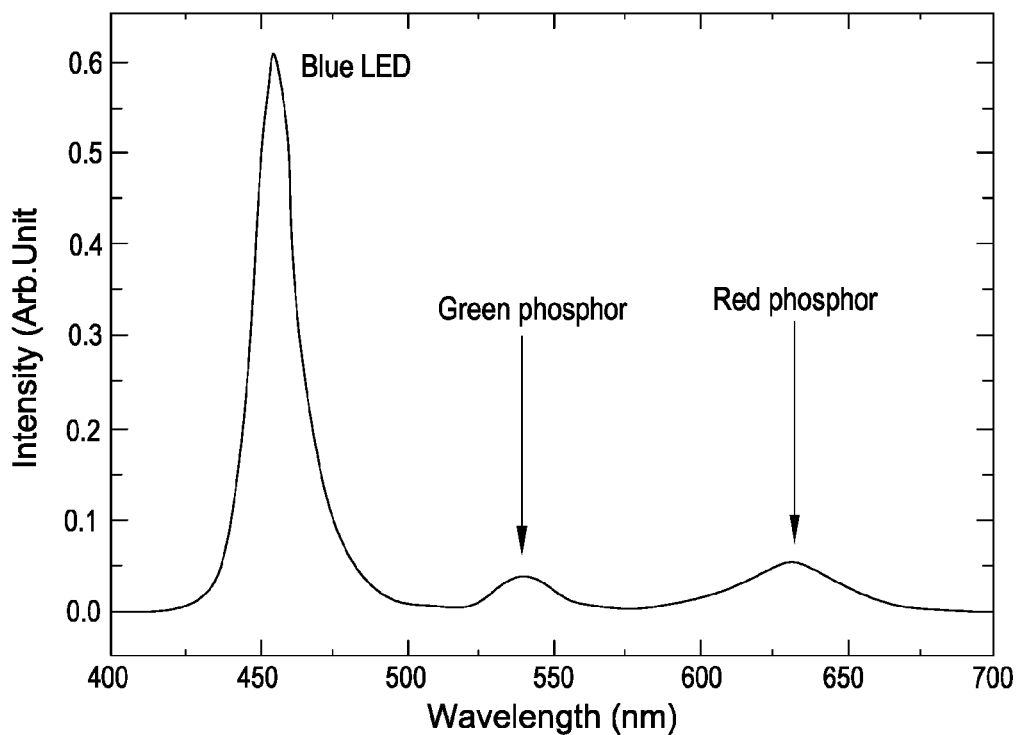
FIG. 8 shows down-converting phosphor applications of perovskite nanoparticles prepared according to embodiments of the present invention.

FIG. 8 shows down-converting phosphor applications of perovskite nanoparticles prepared as described herein.

Generally, the strong photoluminescence properties of perovskite nanoparticles make them very useful as down-converting phosphors to absorb high energy (short wavelength) photons and re-emitting lower energy (longer wavelength) photons.

In this example, two glass substrates coated with a green-emitting and a red-emitting perovskite nanoparticle layer, respectively, are placed above a blue InGaN LED. The relative intensities of the green and red emission may be tuned by varying the thicknesses of the perovskite phosphor layers.

Figure 9:
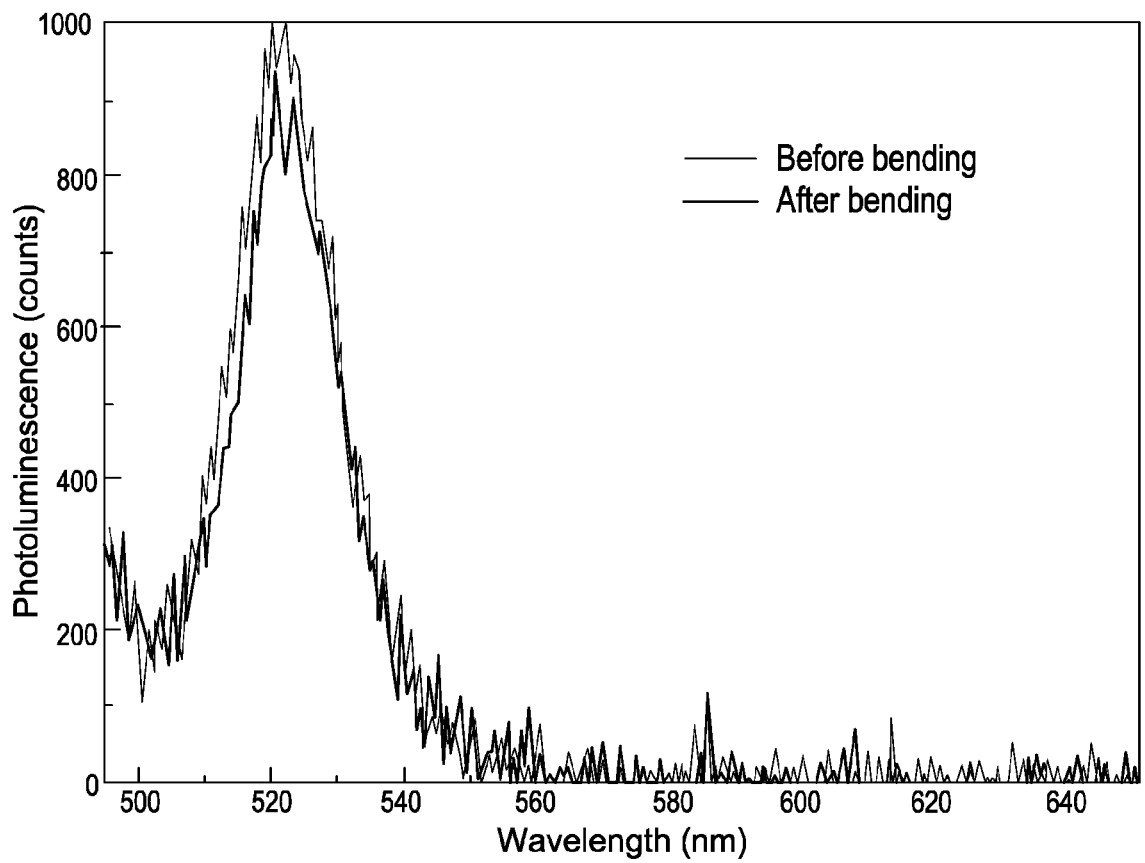
FIG. 9 shows photoluminescence of mechanical stress-treated samples prepared according to embodiments of the present invention.

FIG. 9 shows photoluminescence of mechanical stress-treated samples prepared as described herein.

In this example, the perovskite nanoparticle layer is deposited onto a flexible PET substrate. In order to determine whether the alumina encapsulation layer has an effect on the mechanical flexibility of the perovskite layer, which may affect the photoluminescence, the alumina-encapsulated and non-encapsulated samples are bent multiple times by up to 90°.

As can be seen in FIG. 9, no loss of photoluminescence is observed for the encapsulated sample compared to the non-encapsulated sample. This shows that the alumina encapsulation layer does not have an effect on the mechanical flexibility of the perovskite nanoparticle film to the extent that it would affect the photoluminescence of the perovskite nanoparticles. Furthermore, no cracking of the alumina encapsulation layer or peeling of the encapsulation layer off the perovskite nanoparticle film is observed.

Cross-Linking Method

The following describes highly-efficient perovskite nanocrystal LEDs enabled by a universal cross-linking method. In this example, highly-efficient perovskite LEDs (PeLEDs) were prepared using solution-processed nanocrystals. A TMA vapour-based crosslinking method is used to render the nanocrystal films insoluble, thereby allowing the subsequent charge-injection layers to be deposited without the need for orthogonal solvents. The resulting near-complete nanocrystal film coverage, coupled with the natural confinement of injected charges within the perovskite crystals, facilitate electron-hole capture and give rise to a remarkable electroluminescence yield of above 50%.

In this example, the perovskite crystals comprise perovskite nanocrystals. Nanocrystals generally benefit from solution-processability, bandgap tunability by quantum size effect, narrow-width emission and high photo- and electro-luminescence yield. The synthesis of caesium lead halide perovskite nanocrystals has opened up interesting opportunities towards the photo-physical investigations of these materials, and further allows their commercial exploitations in the form of colourful panel-displays and lighting. Perovskite nanocrystals are shown to have colour-pure emission, close to unity photoluminescent yield and low lasing thresholds. The easy control of halide content allows the perovskite bandgaps to be tailored, both by chemical compositions as well as by quantum confinement effects.

Figure 10:
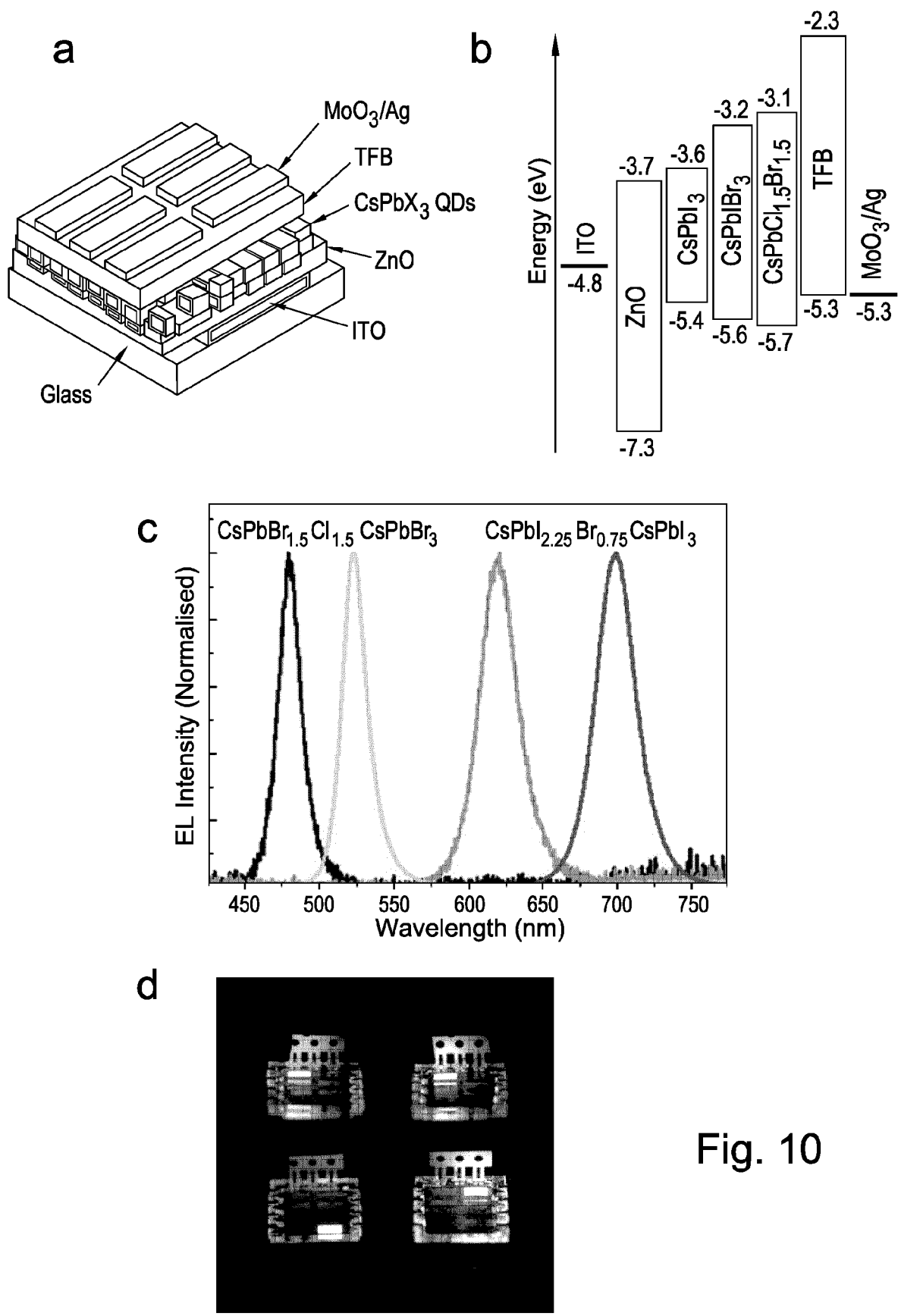
FIG. 10 shows perovskite nanocrystal LED, energy-level diagram, electroluminescence spectra and optical image of perovskite nanocrystal LEDs according to embodiments of the present invention.

The inventors have demonstrated strong and colourful electroluminescence (EL) from cesium lead halide perovskite nanocrystals in a light-emitting diode structure. FIG. 10*a* shows the LED device architecture of the perovskite nanocrystal light-emitting diode used in this study (ITO/ZnO/CsPbX$_3$/TFB/MoO$_3$/Ag, where X represents I, Br or Cl).

FIG. 10*b* shows the energy-level diagram of the materials within the device stack displaying the valence and conduction band levels of the materials in the device. The energy levels were, in this example, estimated from literature values, without taking into account the quantum size effects. The bandgap energies were estimated from the EL emission peaks.

Here, the electron-injection layer comprises of a film of zinc oxide (ZnO) nanocrystal, directly deposited on an indium tin oxide (ITO)-coated glass substrate. The cesium lead halide nanocrystals were deposited onto the ZnO film as the emissive layer. Due to the presence of aliphatic ligands on the nanocrystals, the perovskite film remains soluble to organic solvents, which limits the deposition of subsequent charge-injection layers using solution methods. The inventors employed a trimethylaluminium (TMA) vapour-phase crosslinking technique in this example to fix the nanocrystal film in place, thereby enabling to solution-cast a layer of TFB polymer (poly[(9,9-dioctylfluorenyl-2,7-diyl)-co-(4,4'-(N-(4-sec-butylphenyl)diphenylamine)]) above the nanocrystals without washing them off. TFB serves primarily as a hole-injection and electron-blocking layer. A thin, high workfunction molybdenum oxide ($MoO_3$) interlayer and silver electrode were vacuum-thermal evaporated to complete the device.

FIG. 10c shows electroluminescence spectra of red, orange, green and blue emitting perovskite nanocrystal LEDs. FIG. 10d shows images of the perovskite nanocrystal LEDs in operation.

As can be seen in FIGS. 10c and 10d, the perovskite nanocrystal devices show saturated and colour-pure emission. The perovskite's bandgap is controlled, primarily, by tailoring their halide compositions, and electroluminescence across a wide range of the visible spectrum is achieved with red, orange, green and blue devices emitting at 698 nm, 619 nm, 523 nm and 480 nm. All devices exhibit narrow-width emission, with full-width at half maxima (FWHM) in the range of 17 to 31 nm. The red and green LEDs were made, respectively, from the pure iodide and pure bromide perovskites, while the orange and blue LEDs were made from mixed-halide perovskites, with $CsPbI_{2.25}Br_{0.75}$ and $CsPbBr_{1.5}Cl_{1.5}$ compositions, respectively.

The crosslinking of the perovskite nanocrystals allowed the realization of device structures with enhanced photoluminescent properties. Traditionally, nanocrystals were crosslinked, or made insoluble, using ligand exchange techniques, where shorter-chain bi-functionalized organic ligands (for example diamines or dithiols) were applied to replace the longer-chain oleyl ligands. However, the replacement with smaller ligands often creates cracks and gaps within the nanocrystal film, which could lead to electrical shunts and a reduced device performance. A closer packing of the nanocrystals could also lead to the self-quenching of the nanocrystals and a lower photoluminescence yield, often caused by a more effective Förster resonant energy transfer (FRET) to non-radiative sites. In this example, the inventors have achieved crosslinking by exposing the perovskite nanocrystal film to short pulses of TMA vapour within an enclosed vacuum chamber at room temperature, followed by standing the treated film in ambient air. This creates a well-connected network of aluminium oxide/hydroxide that links the nanocrystals together, hence rendering them insoluble. This vapour-phase technique does not involve ligand exchange processes, and is therefore useful in crosslinking the nanocrystals without altering the original crystal arrangements, thereby allowing much of the film's original structural and electronic properties to be preserved.

The photoluminescence spectra of the nanocrystals also remain unchanged after the TMA treatment, hence confirming that the crosslinking has no effect on their optical bandgap.

Figure 11:
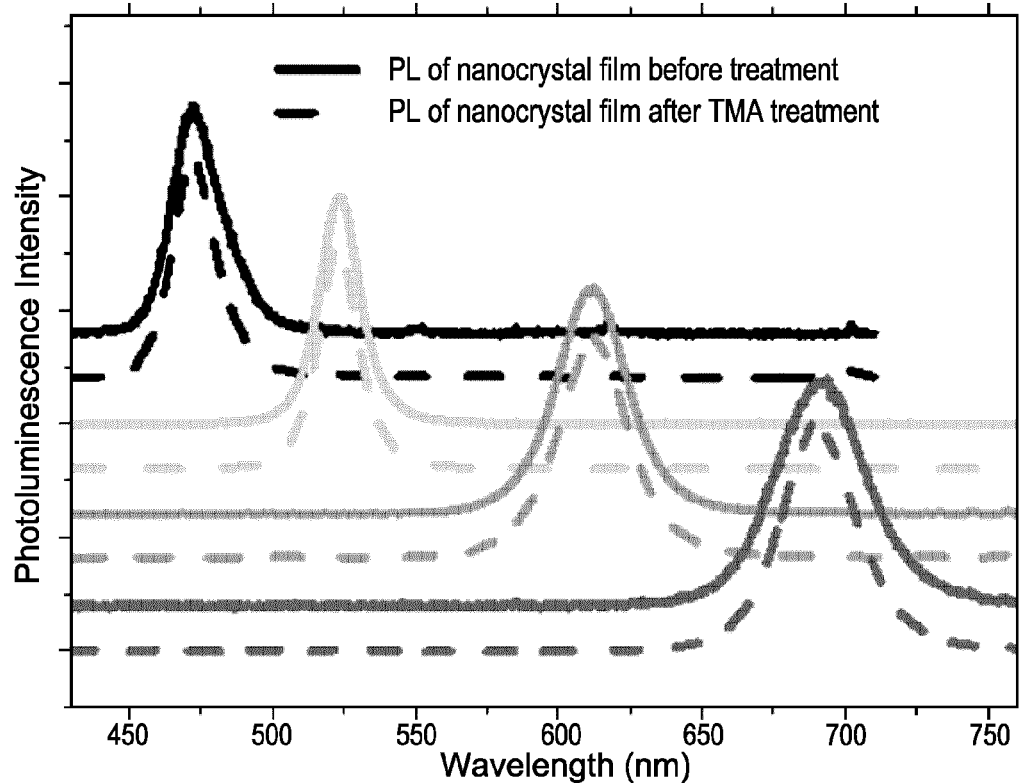
FIG. 11 shows photoluminescence emission spectra of perovskite nanocrystal films according to embodiments of the present invention.

A slightly modified TMA treatment procedure was used for the blue-emitting nanocrystals, as shown in FIG. 11.

FIG. 11 shows PL emission spectra of perovskite nanocrystal films before and after TMA treatment. From top to bottom: $CsPbBr_{1.5}Cl_{1.5}$, $CsPbBr_3$, $CsPbI_{2.25}Br_{0.75}$ and $CsPbI_3$.

PL of $CsPbI_{2.25}Br_{0.75}$ was observed to slightly red-shift upon prolonged (>20 s) TMA treatment. PL of $CsPbBr_{1.5}Cl_{1.5}$ red-shifts under typical TMA treatment procedures, but introducing pulses of water vapour between TMA pulses helps to preserve the optical properties of $CsPbBr_{1.5}Cl_{1.5}$.

In order to investigate the effectiveness of crosslinking, the inventors varied the exposure of the perovskite nanocrystals to different pulse durations of TMA vapour, and measured the nanocrystal retention upon washing with toluene. The crystal retention ratio was determined using UV-visible absorption spectroscopy.

Figure 12:
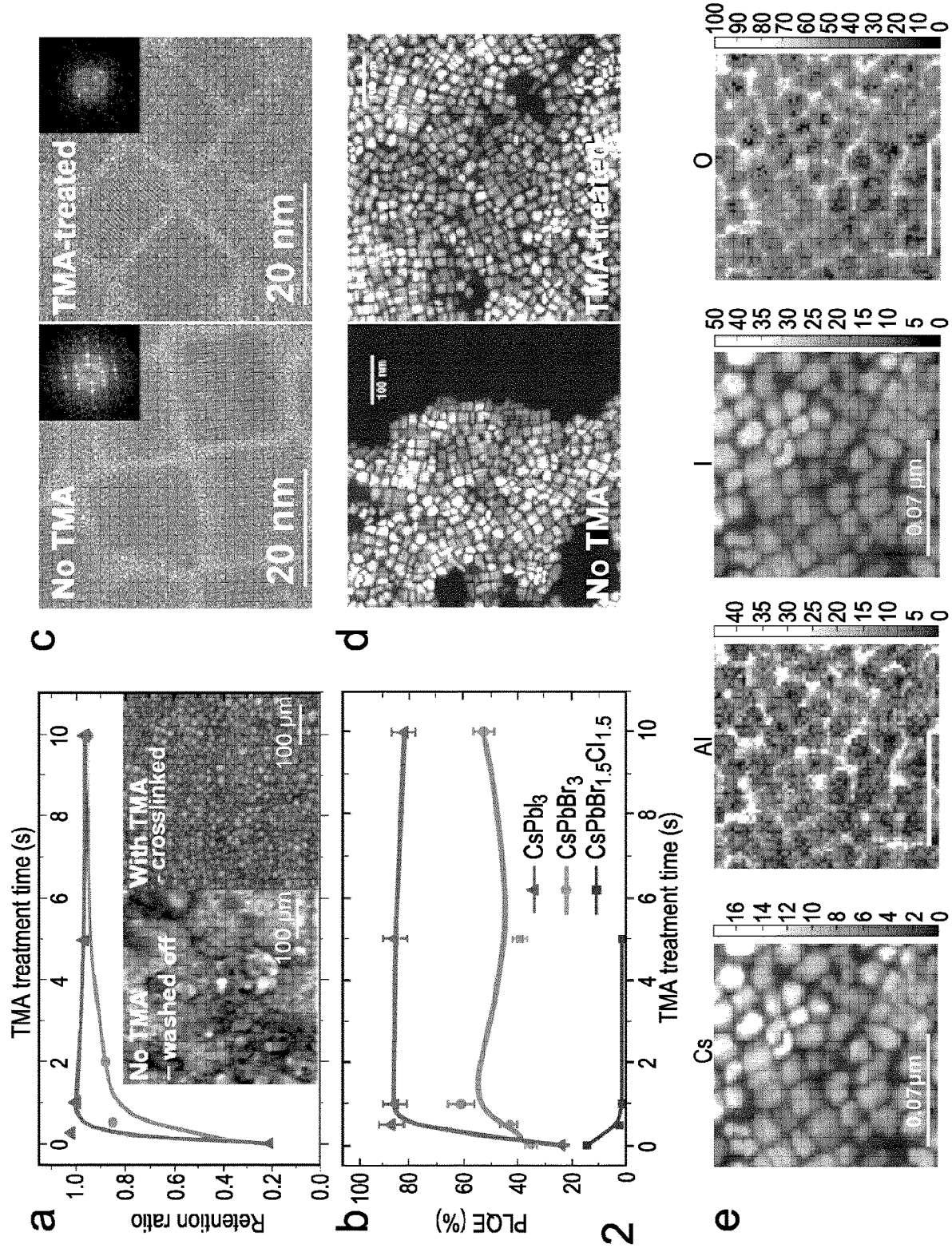
FIG. 12 shows retention ratio, photoluminescent quantum efficiency and high-resolution TEM images of photoluminescent devices according to embodiments of the present invention.

FIG. 12 shows: a, Retention ratio of TMA-treated and non-treated perovskite nanocrystal upon washing with toluene, plotted against the duration of TMA treatment. Inset images show the SEM micrographs of washed off and crosslinked perovskite nanocrystals ($CsPbI_3$), upon washing with toluene. b, Photoluminescence quantum efficiency (PLQE) of perovskite nanocrystals, plotted against the duration of TMA crosslinking treatment. c, High-resolution TEM (HR-TEM) images of untreated and TMA-treated $CsPbI_3$ nanocrystals. d, High-angle annular dark field scanning TEM (HAADF-STEM) images of untreated and TMA-treated $CsPbI_3$ nanocrystals. e, Elemental electron energy loss spectroscopy (EELS) maps for cesium, aluminium, iodine, oxygen.

As shown in FIG. 12a, the crosslinking was remarkably rapid even at room temperature, and a near complete retention of nanocrystals was achieved in less than 0.5 s of TMA exposure. The inset SEM images in FIG. 12c and d show a significant wash-off for the non-crosslinked nanocrystals, while the TMA-treated nanocrystals were completely retained after washing.

Figure 13:
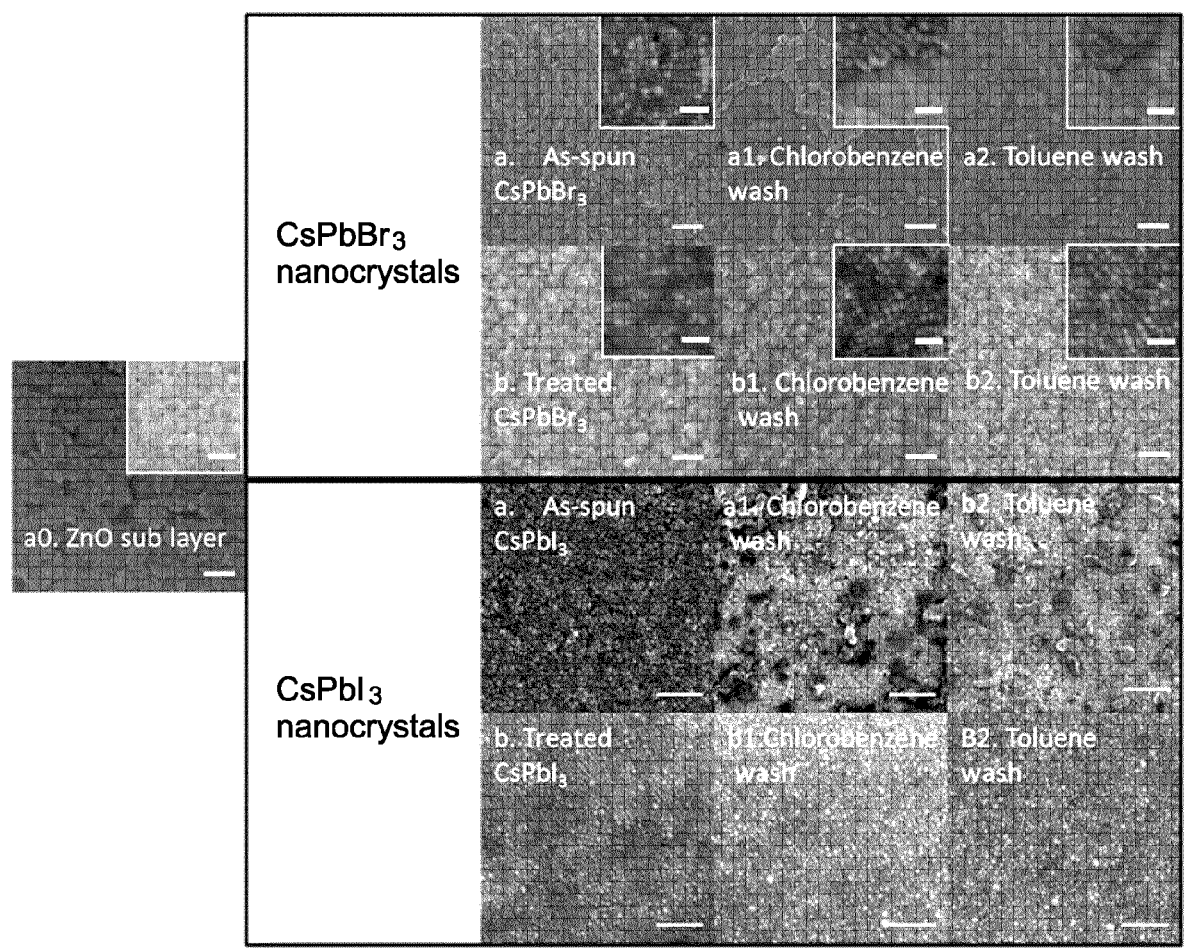
FIG. 13 shows SEM images of perovskite nanocrystal films according to embodiments of the present invention.

Detailed SEM images of nanocrystal films, upon washing with different organic solvents, are shown in FIG. 13. The top SEM images in FIG. 13 show: (a0) ITO/ZnO, (a) ITO/ZnO/$CsPbBr_3$ and washed film off (a) by (a1) chlorobenzene and (a2) toluene; (b) ITO/ZnO/$CsPbBr_3$ film treated with TMA for 5 seconds and washed film off (b) by (b1) chlorobenzene and (b2) toluene. The scale bar for the main image and the inset are 200 nm and 50 nm, respectively. The bottom SEM images show: (a) ITO/ZnO/$CsPbI_3$ and washed film off (a) by (a1) chlorobenzene and (a2) toluene; (b) ITO/ZnO/$CsPbI_3$ film treated with TMA for 10 seconds and washed film off (b) by (b1) chlorobenzene and (b2) toluene. The scale bar for the main image is 200 nm.

Interestingly, the inventors observed a corresponding increase in the photoluminescence quantum efficiency (PLQE) of $CsPbI_3$ and $CsPbBr_3$ with TMA treatment, but a decrease in the case of $CsPbBr_{1.5}Cl_{1.5}$ (FIG. 12b). This PL enhancement is particularly remarkable for the $CsPbI_3$ nanocrystals, raising its PL 3 times from ~30% in the untreated film to ~90% in the TMA-treated film. We note that this is possibly one of the highest PLQE achieved in a non-core-shell structured nanocrystal thin film.

In an attempt to unravel the origins of the PL enhancement, the inventors took high-resolution transmission electron microscopy (HR-TEM) images (FIG. 12c) and high-angle annular dark field scanning TEM (HAADF-STEM) images (FIG. 12d) of the CsPbI$_3$ perovskite nanocrystals before and after TMA treatment, and further analysed the distribution of aluminium using electron energy loss spectroscopy (EELS) mapping (FIG. 12e). The nanocrystals show a size distribution of, in this example, 15 to 25 nm, which points to minimal quantum size effect in their electronic bandgap. The inventors analysed the spacing distribution between the nanocrystals in the HR-TEM images, and found the average crystal spacing to increase, in this example, from 1.6 nm to 1.9 nm upon TMA treatment, as a result of aluminium incorporation. We note that a spacing of 1.6 nm between the crystals represent approximately 0.55 ligand attachment per unit cell of the perovskite lattice. The spacing distribution analysis is shown in FIG. 14.

Figure 14:
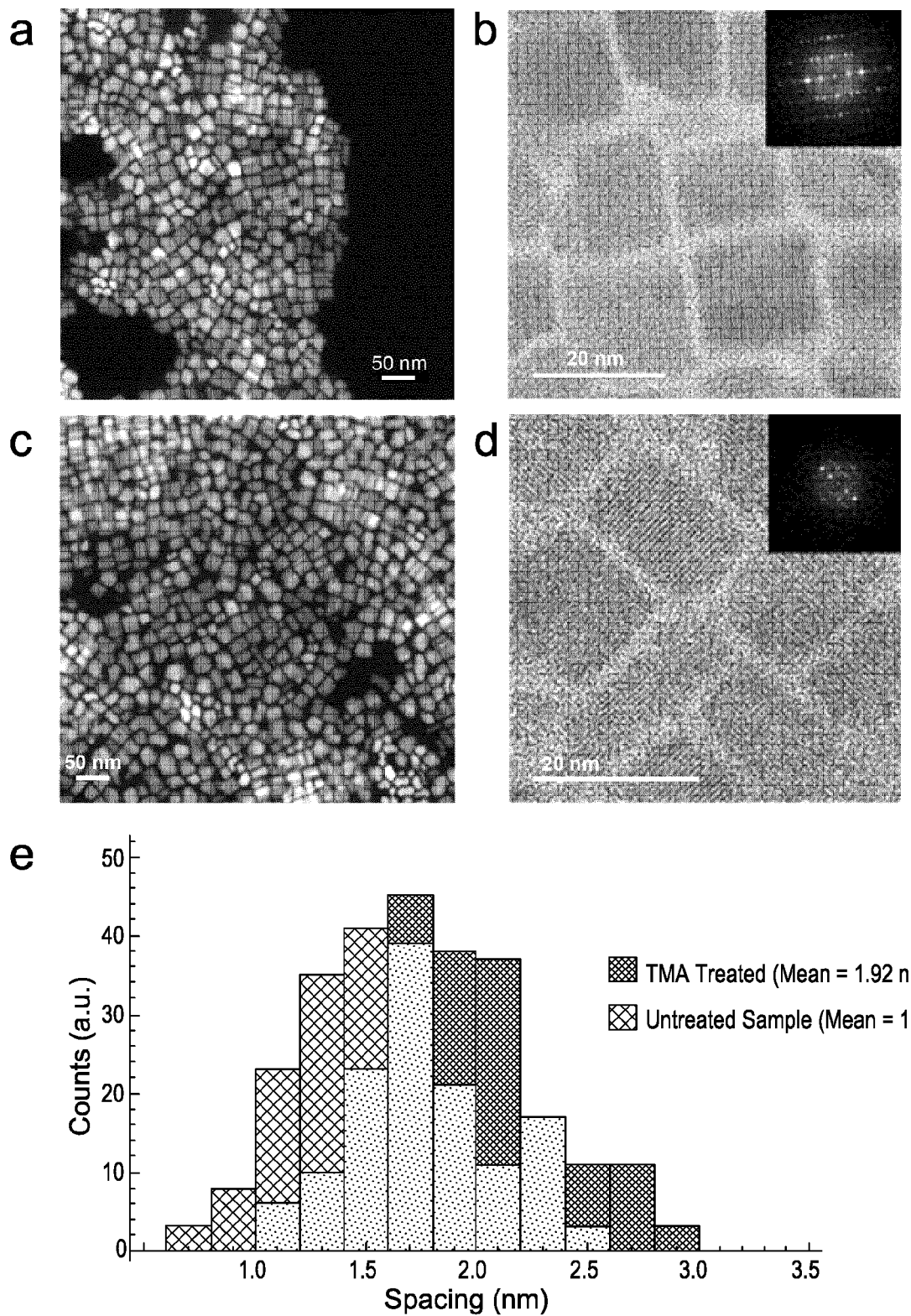
FIG. 14 shows high-angle annular dark field scanning TEM images of perovskite nanocrystals according to embodiments of the present invention.

FIG. 14 shows: (a) High-angle annular dark field scanning TEM (HAADF-STEM) and (b) high-resolution TEM (HR-TEM) images of untreated CsPbI$_3$ nanocrystals. (c) HAADF-STEM and (d) HR-TEM of TMA-treated CsPbI$_3$ nanocrystals. The TEM images show that the nanocrystals are well dispersed and single crystalline, presenting an average size of 15 nm to 25 nm. (e) Nanocrystal spacing distribution for untreated and TMA treated CsPbI$_3$. Analysis of the spacing between the nanocrystals for the treated and untreated samples shows an average increase of 0.3 nm after TMA treatment.

Figure 15:
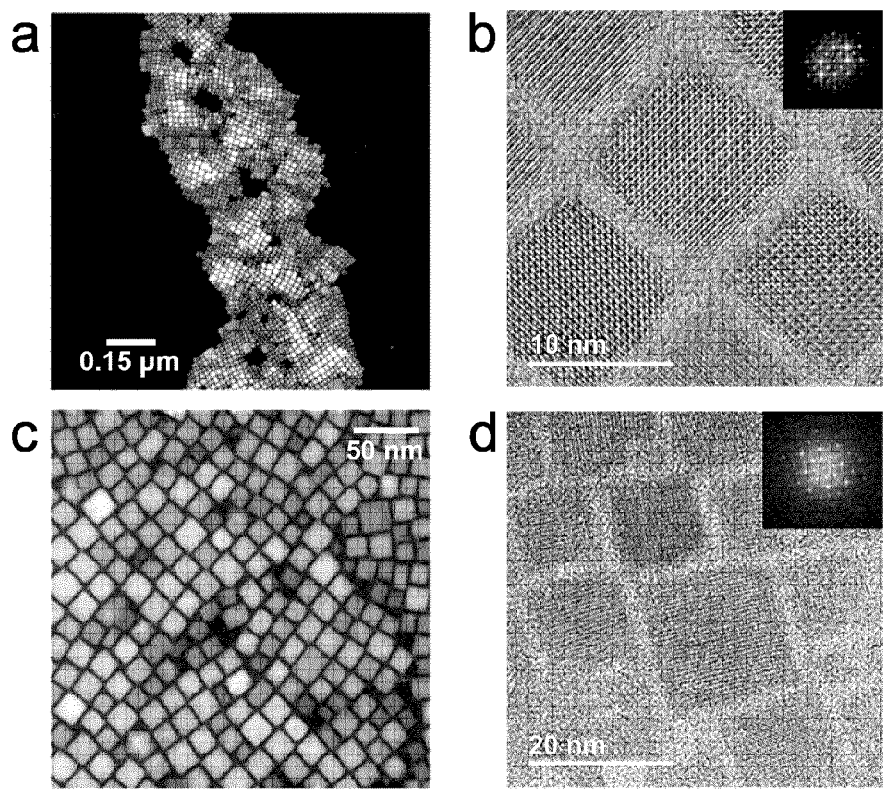
FIG. 15 shows HAADF-STEM and HR-TEM images of perovskite nanocrystals according to embodiments of the present invention.

Further TEM images of CsPbBr$_3$ perovskite nanocrystals are shown in FIG. 15 ((a) HAADF-STEM and (b) HR-TEM images of untreated CsPbBr$_3$ nanocrystals. (c) HAADF-STEM and (d) HR-TEM of TMA-treated CsPbBr$_3$ nanocrystals).

The EELS map in FIG. 12e shows that aluminium and oxygen elements are primarily located in the gaps between the cesium and iodine rich nanocrystal domains, thereby indicating that the TMA intercalates among the ligands between the crystals, and leads to the small increase in the crystal spacing. While this 0.3 nm increase in spacing may lead to a smaller degree of PL quenching by FRET, it is unlikely to fully account for the 3-fold enhancement in PL yield. The changes in PL are therefore likely to be chemical in nature, where the introduction of TMA chemically passivates the nanocrystal surface and lead to a reduction in PL-quenching defects.

Figure 16:
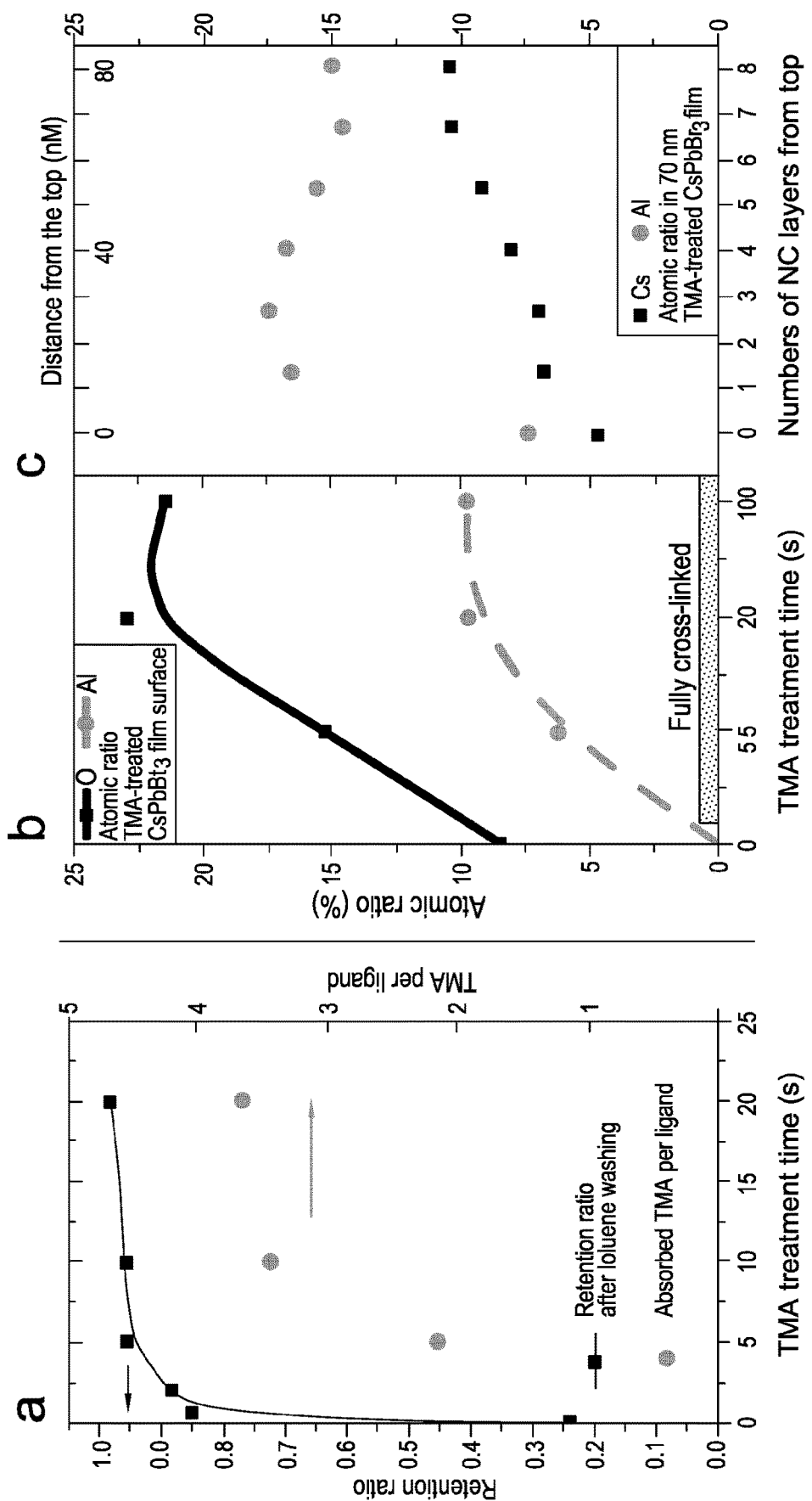
FIG. 16 shows retention ratio and number of TMA absorbed per ligand, atomic ratio of Al/(Al+O+C+Cs+Pb+Br) and XPS depth profile of perovskite crystals according to embodiments of the present invention.

To further verify that the aluminium gets incorporated between the crystal spacing and not above the nanocrystal film, the inventors measured the x-ray photoelectron spectra (XPS) of the sample as a function of film depth, and found aluminium to be quite evenly distributed across the entire nanocrystal film thickness (see XPS depth profile in FIG. 16).

FIG. 16 shows: (a) Comparison of retention ratio and number of TMA absorbed per ligand. Number of TMA absorbed per ligand is estimated by atomic ratio of Al to C. (b) Atomic ratio of Al/(Al+O+C+Cs+Pb+Br) plotted against TMA treatment time. Atomic ratios are determined by x-ray photoelectron spectroscopy (XPS) measurements. (c) XPS depth profile of Al and Cs atomic ratios of a 70 nm CsPbBr$_3$ film, treated with TMA over 20 s. The XPS measurements were performed, in this example, in an ultrahigh-vacuum chamber (ESCALAB 250Xi) using an XR6 monochromatic Al KR X-ray source (hv=1486.6 eV) with a 900 μm spot size.

To elucidate the chemical crosslinking mechanism, the inventors measured the infra-red (IR) transmittance spectra of our nanocrystal samples before and after the TMA treatment. For comparison, the inventors also measured the IR spectra of the organic ligands, and plotted them on the same graph in FIG. 17a (which shows Fourier transform infra-red (FTIR) spectra of perovskite nanocrystals and their ligands before and after TMA treatment).

Three distinct changes could be observed in the IR spectra following the TMA treatment.

1) A broad peak centered around 3450 cm$^{-1}$ is produced in all the TMA-treated samples, signally the presence of O—H stretch. This confirms the role of ambient water in the crosslinking process.

2) Another broad peak appears around 630 cm$^{-1}$, and this is characteristic of vibrational modes in alumina.

3) A strong band appears at 1576 cm$^{-1}$, which can be assigned to weakened C=O stretching. This is particularly clear in the case of TMA-treated oleic acid.

It is likely that the bonding of the carboxylate group to the strongly Lewis acidic aluminium causes the C=O bond to be weakened, thereby giving a lower than usual stretching frequency. Interestingly, the C=O stretching band does not appear in the pristine nanocrystal samples, but only emerges after TMA treatment. This is likely to be due to the coordination of the carboxylate group to the nanocrystals, thereby diminishing its double-bond character.

Figure 17:
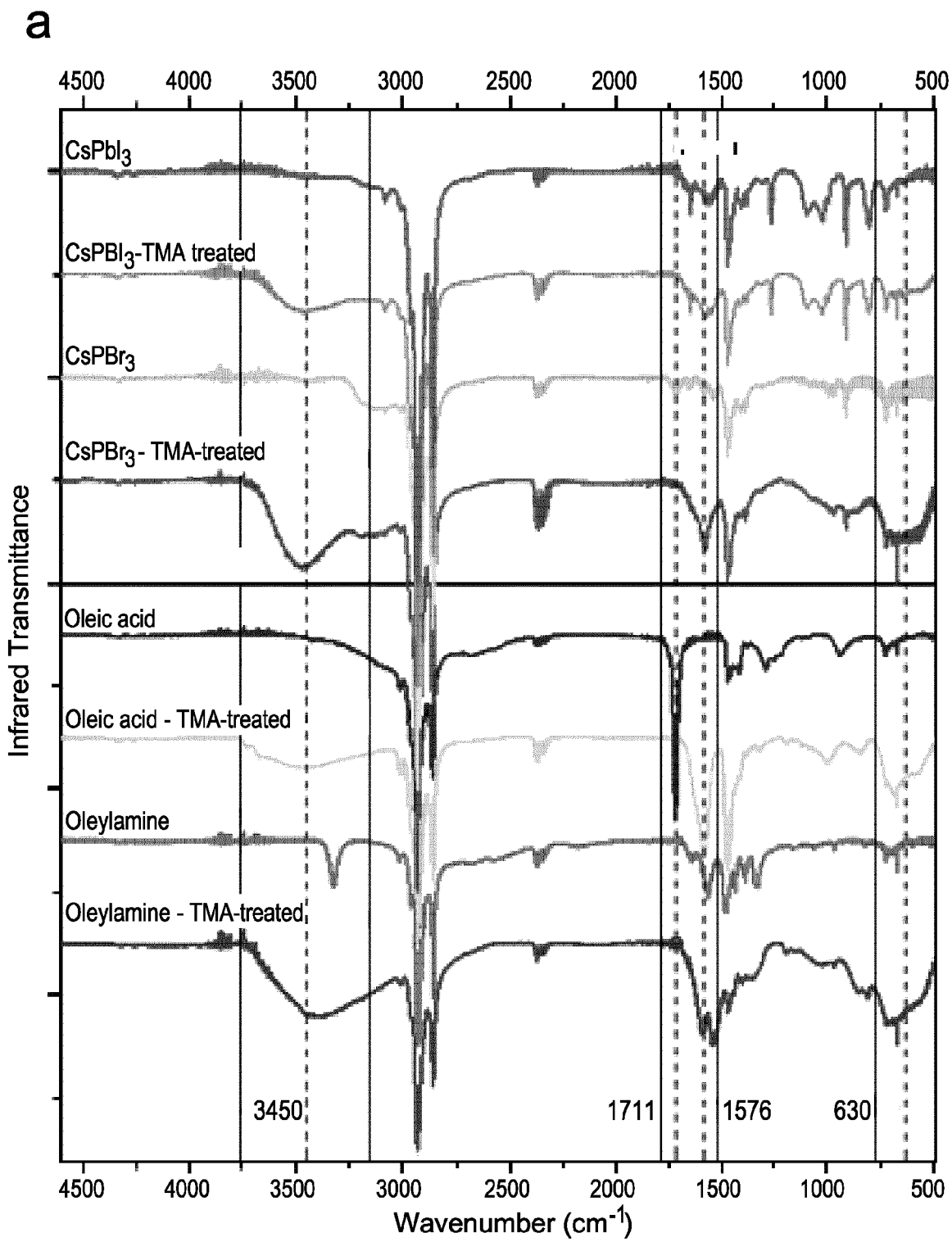
FIG. 17 shows Fourier transform infra-red spectra of perovskite nanocrystals and reaction schematic of TMA crosslinking process according to embodiments of the present invention.
Figure 17:
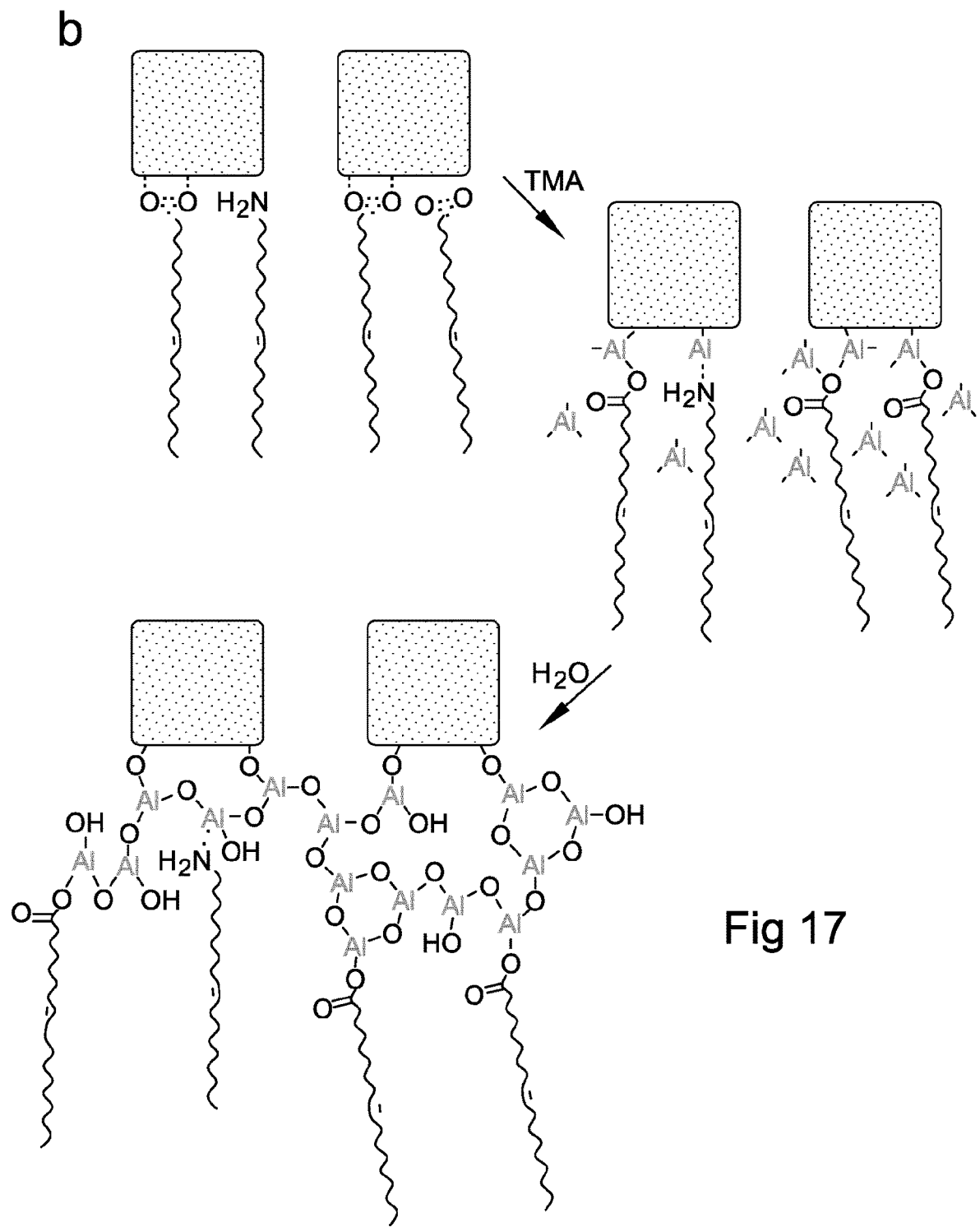

With this information, the inventors propose a reaction mechanism for the crosslinking process as shown in FIG. 17b (reaction schematic of the TMA crosslinking process). The introduction of TMA coordinates and reacts with the carboxylate and amino groups of the ligands, adjacent to the nanocrystals. The subsequent exposure to ambient moisture hydrolyzes the remaining methyl-aluminium to give a network of alumina and aluminium hydroxide that are covalently bonded to the ligands. The alumina that is formed next to the crystal surface successfully passivates the surface defects, thereby enhancing the crystals' photoluminescence yield.

The strongly reactive TMA appears to be benign towards the iodide and bromide perovskites, but causes some level of damage to the chloride perovskites, hence resulting in a degradation of PL in the latter.

To further verify the role of ligands in this crosslinking process, the inventors attempted to wash-off TMA-treated oleic acid and oleylamine (i.e. no nanocrystals) with toluene.

Figure 18:
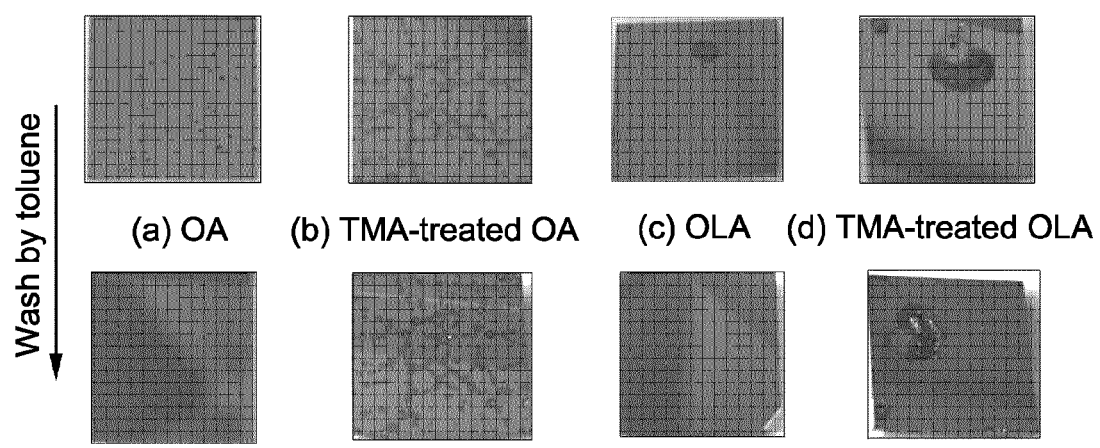
FIG. 18 shows optical images of perovskite crystal films according to embodiments of the present invention.

FIG. 18 shows images of (a) OA droplets deposited from solution in toluene, (b) TMA-treated OA droplets, (c) OLA droplets deposited from solution in toluene, (d) TMA-treated OLA droplets. The droplets were subsequently washed with toluene to test for crosslinking. In these examples, image contrast has been enhanced.

As shown in FIG. 18, the ligands were completely cross-linked and insoluble upon TMA treatment, hence confirming that the ligands are chemically incorporated into the alumina network across the entire nanocrystal film.

Figure 19:
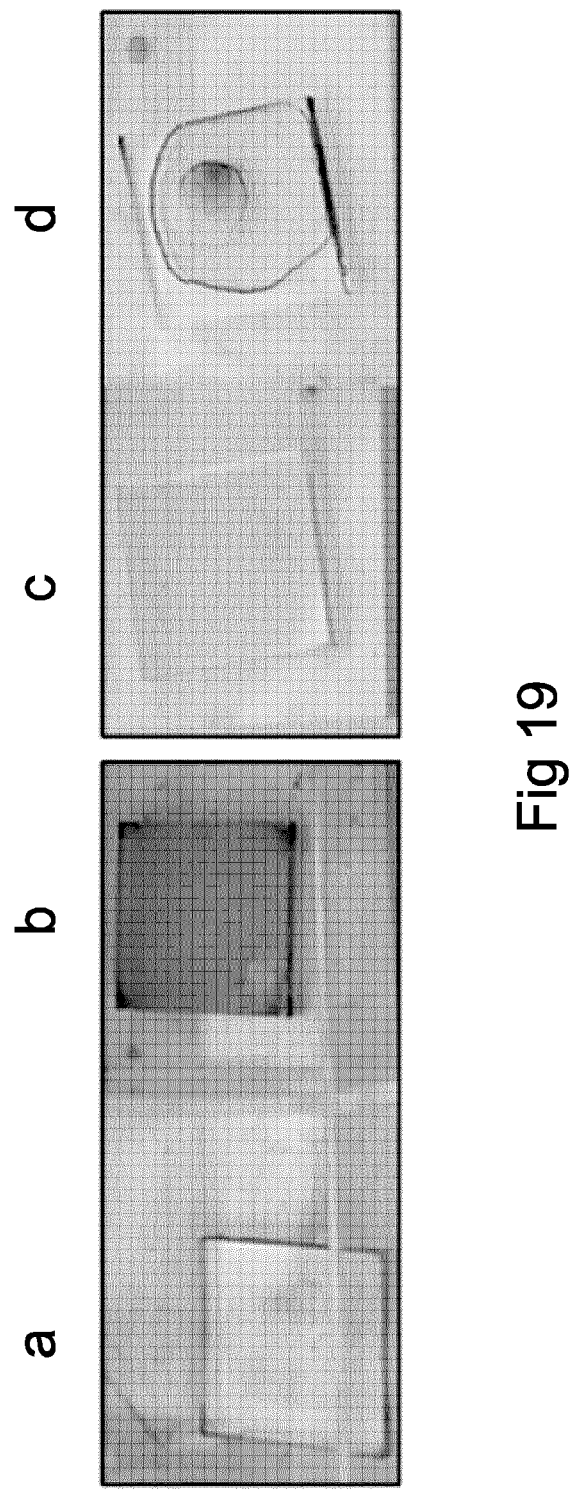
FIG. 19 shows optical images of perovskite crystal films according to embodiments of the present invention.

In order to prove the generality of our crosslinking technique, the inventors treated thin films of CdSe and PbS nanocrystals with TMA, and demonstrate them to be insoluble to organic solvents upon treatment (see FIG. 19).

FIG. 19 shows: (a) CdSe quantum dot (QD) film washed by toluene. (b) TMA-treated CdSe QD film washed by toluene. (c) PbS QD film washed by toluene. (d) TMA-treated PbS QD film washed by toluene.

The TMA crosslinking has enabled the inventors to make good-performance light-emitting devices using these nanocrystalline lead halide perovskites.

FIGS. 20a to 20d show the detailed device characteristics of the perovskite nanocrystal LEDs. The individual Figures show: a, Luminance vs. voltage plots of perovskite nanocrystal LEDs. b, Current density vs. voltage plots of perovskite nanocrystal LEDs. c, External quantum efficiency vs. voltage plots of perovskite nanocrystal LEDs. d, Table of summary of perovskite nanocrystal LED performance.

Figure 20:
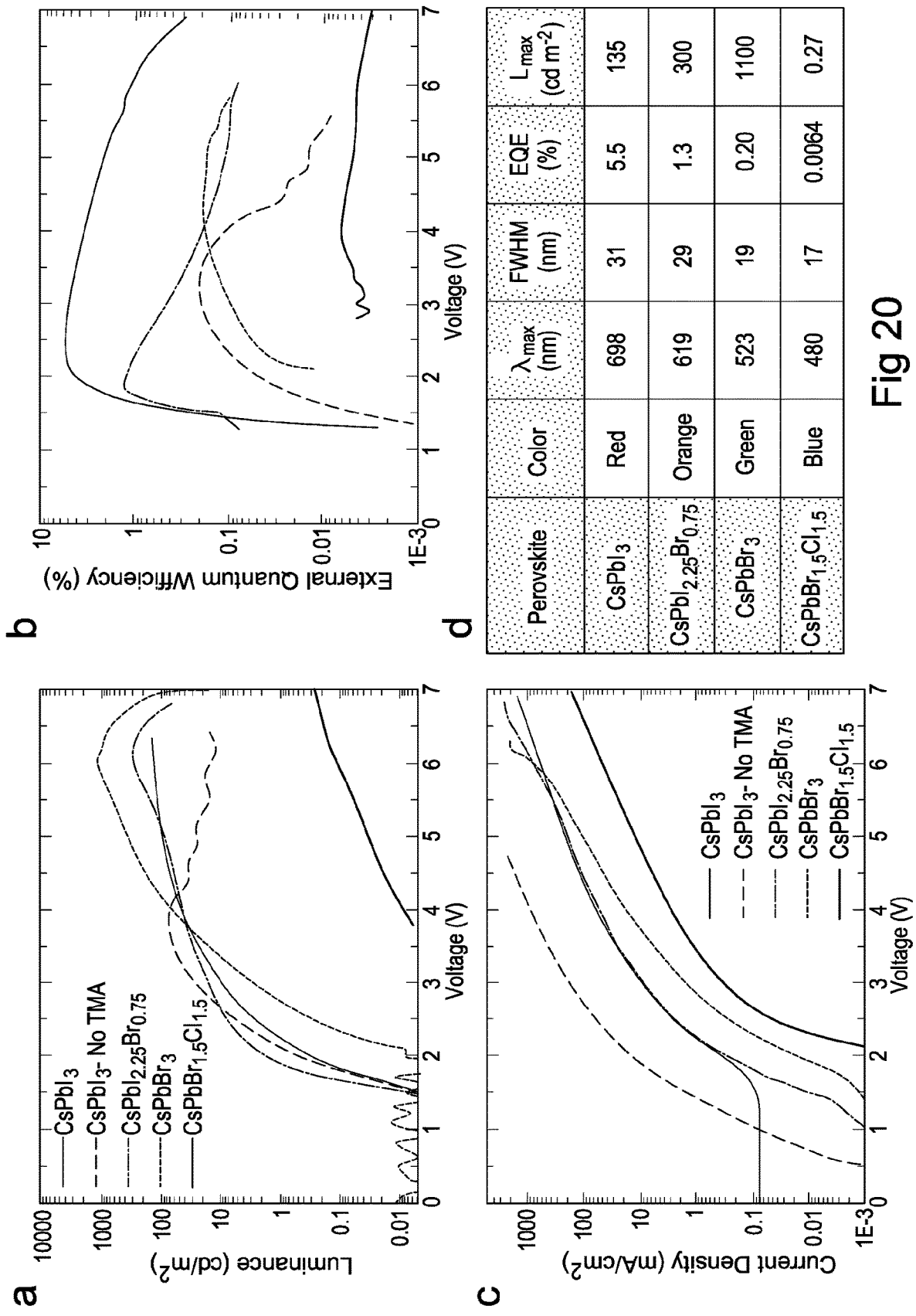
FIG. 20 shows luminance, external quantum efficiency and current density versus voltage of perovskite nanocrystal LEDs according to embodiments of the present invention.

Due to the inherent sensitivity of human eyes towards green, the highest luminance of 1100 cd m$^{-2}$ was achieved in the CsPbBr$_3$ device at a driving voltage of 6V and a current density of 712 mA cm$^{-2}$. As shown in FIG. 20b, current density follows a general decreasing trend from the red-emitting to the blue-emitting devices, as expected due to the higher turn-on voltages required for injecting charges into the larger bandgap perovskites.

For comparison, the inventors plotted the current-voltage characteristics of the non-TMA-treated CsPbI$_3$ device, and show that the current density is more than an order of magnitude higher than the crosslinked counterpart, even at similar or lower luminance levels. This is clear indication of current leakage, which is a result of the washing-off of perovskite nanocrystals in the non-crosslinked device.

This result is also reflected in the external quantum efficiency (EQE) calculations in FIG. 20c, where the inventors achieved a remarkable EQE of 5.5% in the crosslinked CsPbI$_3$ device, again more than an order of magnitude higher than the non-crosslinked device.

We note that the CsPbI$_3$ device emits at 698 nm, close to the edge of human eye sensitivity, and therefore gives a modest luminance level.

The EQE of the nanocrystals device generally decreases with the widening of the perovskite bandgap. This is in line with the trends of a lower PLQE in the green and blue materials (see FIG. 12b). The less ideal charge injection into larger bandgap perovskites could also result in the lower device efficiency.

FIG. 20d gives a summary of the key performance parameters of the nanocrystal LEDs described herein.

Figure 21:
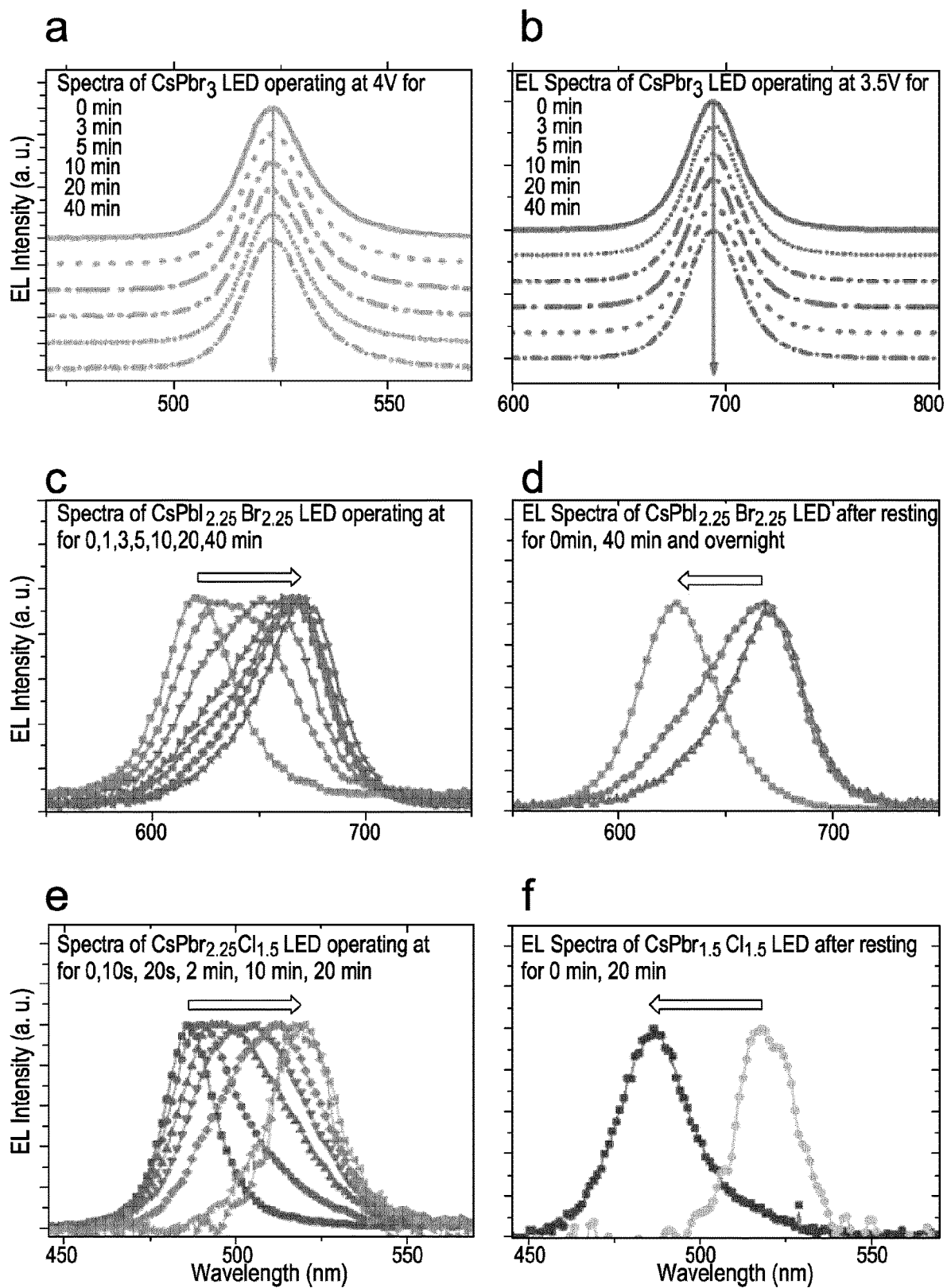
FIG. 21 shows electroluminescence intensity of perovskite crystals according to embodiments of the present invention.

During the investigation of the mixed-halide perovskite nanocrystals (CsPbI$_{2.25}$Br$_{0.75}$ and CsPbBr$_{1.5}$Cl$_{1.5}$), the inventors noticed that the emissions shift reversibly towards higher wavelengths during their operation, and returns slowly towards their original state after resting (see FIG. 21).

FIG. 21 shows the evolution of EL spectra over operation time. (a) EL spectra of CsPbBr$_3$ LED operated at 4 V. (b) EL spectra of a CsPbI$_3$ LED operated at 3.5 V. (c) EL spectra of CsPbI$_{2.25}$Br$_{0.75}$ LED operated at 3.5 V, showing a gradual red-shift. (d) EL spectra of CsPbI$_{2.25}$Br$_{0.75}$ LED after resting, showing a reversal of the red-shift. (e) EL spectra of CsPbBr$_{1.5}$Cl$_{1.5}$ LED operated at 5.5 V, showing a gradual red-shift. (f) EL spectra of CsPbBr$_{1.5}$Cl$_{1.5}$ LED after resting, showing a reversal of the red-shift.

This emission shift is not observed in the pure halide samples. This may be related to previous observations on photoluminescence shifts in mixed-halide perovskites upon photoexcitation, which was suggested to be due to phase segregation into purer halide phases.

We note that the films described herein consist of spatially-separated nanocrystals, and any phase segregation or halide rearrangements could therefore occur only within a small domain of less than 20 nm. The inventors further show in FIG. 22 that the EL shifts (electrical excitation) are completely consistent with the PL shifts (photoexcitation), thereby confirming that the shifts are a result of intrinsic changes within the perovskites, and not due to a change in the device charge injection properties during operation.

Figure 22:
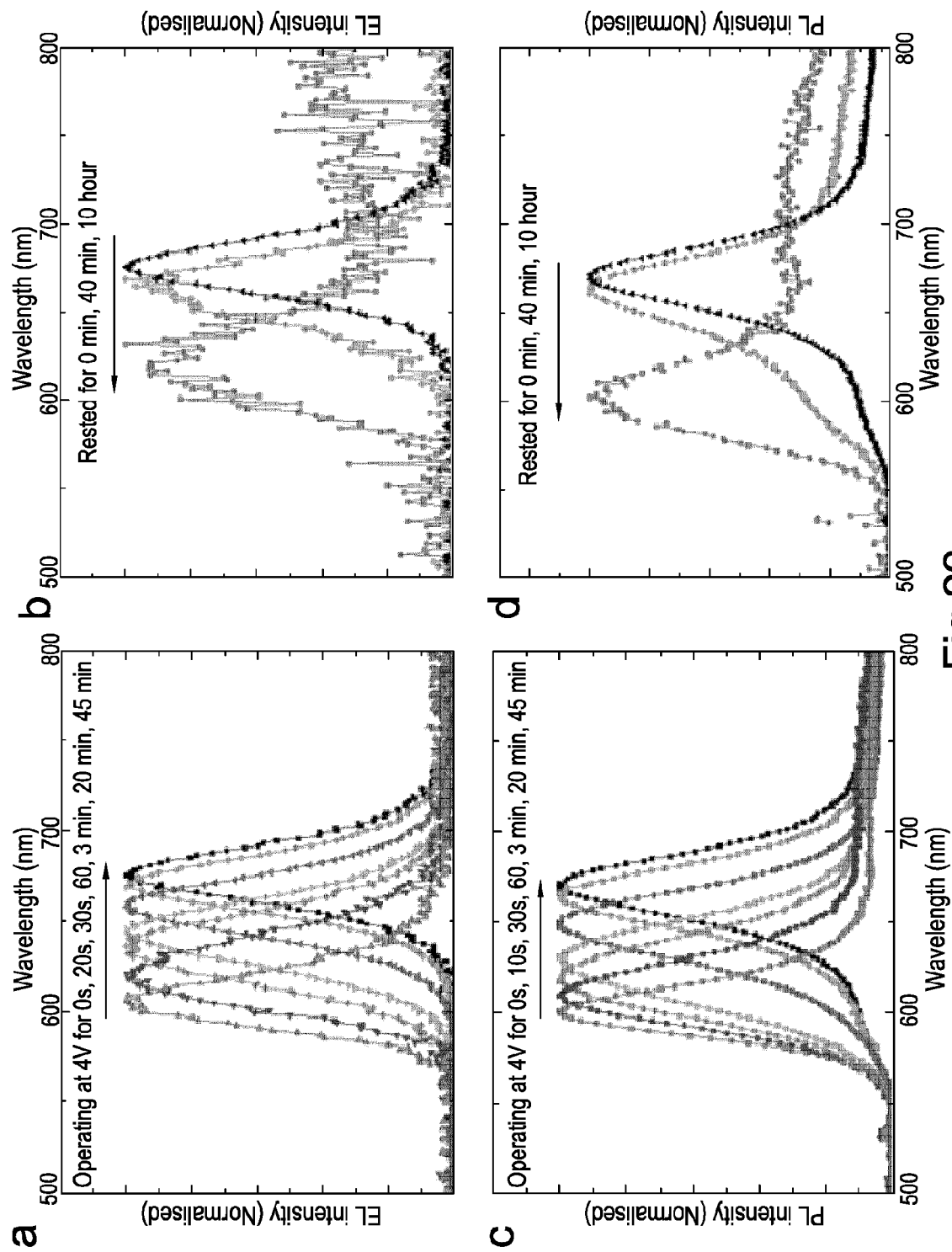
FIG. 22 shows electroluminescence and photoluminescence spectra of perovskite crystals according to embodiments of the present invention.

FIG. 22 shows a comparison of EL and PL spectra of CsPbI$_{2.25}$Br$_{0.75}$ within the same time window during the LED operation. The EL and PL spectra were taken alternatively using the same optical setup.

The individual FIG. 22 show: (a) EL spectra of LED, showing a gradual red-shift over time. (b) EL spectra of LED after resting, showing a reversal of the red-shift. (c) PL spectra of the LED, showing a consistent red-shift with the EL. (d) PL spectra of the LED after resting, showing a consistent reversal of the red-shift. The device pixels were photo-excited with a 532 nm CW laser during PL measurements. The laser peak is filtered off with an optical long-pass filter.

The inventors have now successfully departed from the traditional core-shell nanocrystal approach, and shown that highly-efficient electroluminescence could be realized in semiconductor nanocrystals using a simple TMA crosslinking technique.

The remarkable ability of alumina to double as a surface passivating agent further makes the TMA treatment an attractive technique for the fabrication of quantum dot optoelectronic devices. Indeed, given their intensely luminescent properties, versatile color tuning, coupled with an enhanced thermal stability, these all-inorganic lead halide perovskites may quickly emerge as strong contenders in the color display industry.

Materials and Methods

Materials: TFB was provided by Cambridge Display Technology (CDT) and was used as received. All other chemicals were purchased from Sigma-Aldrich, and were used as received.

Synthesis of CsPbX$_3$ (X=Cl, Br, I) Nanocrystals

Perovskite nanocrystals were synthesized using the following procedure.

In this example, Cs$_2$CO$_3$ (0.814g, 99.9%) was loaded into 100 mL 3-neck flask along with octadecene (30 mL, 90%) and oleic acid (2.5 mL, OA, 90%), and the mixture was dried for 2 h at 120° C. under N$_2$. The solution was lowered to 100° C. for transfer by injection. ODE (75 mL), oleylamine (7.5 mL, OLA, 90%) and dried OA (7.5 mL) and PbX$_2$ (2.82 mmol) such as PbI$_2$ (1.26 g, 99.99%), PbBr$_2$ (1.035 g, 99.99%), PbCl$_2$ (0.675g, 99.99%) or their mixtures were loaded into a 250 mL 3-neck flask and dried under vacuum for 2 h at 120° C.

After complete solubilisation of the PbX$_2$ salt, the temperature was raised to 170° C. and the Cs-oleate solution (6.0 mL, 0.125 M in ODE, prepared as described above) was quickly injected. After 10 s, the reaction mixture was cooled in an ice-water bath.

For CsPbCl$_3$ synthesis, 1 mL of trioctylphosphine (TOP, 97%) was added to solubilize PbCl$_2$. The nanocrystals were precipitated from solution by the addition of equal volume anhydrous butanol (BuOH, 99%) (ODE:BuOH=1:1 by volume).

After centrifugation, the supernatant was discarded and the nanocrystals were redispersed in anhydrous hexane (99%) and precipitated again with the addition of BuOH (Hexane:BuOH=1:1 by volume). These were redispersed in hexane.

The nanocrystal dispersion was filtered through a 0.2 μm PTFE filter and diluted to 10 mg/mL in hexane before use.

Synthesis of ZnO Nanocrystals

In this example, colloidal ZnO nanocrystals were synthesized by a solution-precipitation process according to the following procedure. Typically, zinc acetate dihydrate (329 mg) was dissolved in dimethyl sulphoxide (DMSO) (0.5 M) by stirring at room temperature.

A solution of tetramethylammonium hydroxide (TMAH, 453 mg) in ethanol (5 mL) was then added dropwise within 5 min. After 2 h, the product mixture was decanted and washed twice with ethyl acetate and ethanol.

Ethanol (6 mL) was added to disperse the precipitate and produce a colloidal ZnO nanocrystal dispersion with a concentration of ~7 mg/mL.

The dispersion was filtered with a 0.45 μm PTFE filter before use.

Crosslinking of Perovskite Nanocrystals

A BENEQ TFS20 atomic layer deposition (ALD) system was used in this example for the vapour-phase crosslinking treatment.

High purity trimethylaluminium (TMA) was purchased from SAFC Hitech. The deposition temperature was set at 18±1° C., which is also the typical ambient room temperature.

The reactor chamber was pumped down below 0.2 mbar before starting the process.

TMA was applied in short pulses at a partial pressure of ~0.005 mbar. The dosage of TMA was controlled by varying the total length of TMA pulses between 0.25 s and 20 s.

The inventors limit the duration of each pulse to 1 s, hence a 10 s dosage is, for instance, achieved with 10×1 s pulses.

LED Device Fabrication

A 7 mg/ml dispersion of ZnO nanocrystals in ethanol was spin-coated in this example onto an ITO-coated glass substrate at 1500 rpm for 30 s, followed by heat annealing at 100° C. for 10 minutes in a nitrogen-filled glovebox to give a 15 nm film.

A 10 mg/ml perovskite nanocrystal dispersion in hexane was spin-coated at 1000-8000 rpm for 20 s in air to give a 15-60 nm film.

The films were allowed to dry in air for ~10 minutes, and were transferred into the ALD chamber for crosslinking treatment.

Following the crosslinking step, a solution of TFB in toluene (10 mg/mL) was spin-coated on top of the perovskite nanocrystals at 2000 rpm for 30 s in the glovebox to give a 60 nm thin film.

$MoO_3$ (5 nm) and Ag (80 nm) metal layers were deposited by thermal evaporation in a high-vacuum of below $5×10^{-6}$ mbar.

LED Characterization

Current vs. voltage characteristics were measured in this example using a Keithley 2400 source measure unit.

Photon flux was measured simultaneously using a calibrated silicon photodiode centred over the light-emitting pixel. Luminance in $cd/m^2$ was calculated based on the emission spectrum of the LED, weighted against the standard luminosity function and on the known spectral response of the silicon photodiode.

External quantum efficiency was calculated assuming a Lambertian emission profile.

Electroluminescence spectra were measured using a Labsphere CDS-610 spectrometer.

Optical Characterization

In the PL measurements, nanocrystal films were placed in a nitrogen-flushed integrating sphere and were photo-excited using a 405 nm continuous-wave laser (1.5 mW).

The laser and the emission signals were measured and quantified using a calibrated Andor iDus DU490A InGaAs detector for the determination of PL quantum efficiency.

UV-visible absorption of the nanocrystal films was measured using a HP 8453 spectrometer.

FTIR Measurements

Mid-IR FTIR data was measured by an Agilent Technologies Cary 600 Series FTIR spectrometer.

Nanocrystals were spin-coated onto a KBr substrate, and measured in the wavenumber range of 5000 $cm^{-1}$ to 500 $cm^{-1}$.

Electron Microscopy

Transmission electron microscopy (TEM) characterisation was carried out on close-packed $CsPbI_3$ and $CsPbBr_3$ nanocrystals that were drop-casted on thin TEM carbon grids. The TEM samples were analysed through high-angle annular dark field STEM (HAADF-STEM), using a Fischione detector on a FEI Tecnai Osiris TEM/STEM 80-200 microscope, operated at 200 kV.

Electron energy loss spectroscopy (EELS) data were acquired using a FEI Tecnai Osiris TEM/STEM 80-200 microscope, operating at 200 kV and equipped with a Gatan Enfinium ER 977 spectrometer.

Core-loss spectra were acquired over different regions of the specimen, using a 2 nm pixel size. All spectra were corrected for dark current and gain variations in the detector.

Principal component analysis (PCA) has been used to reduce the dimensionality and the noise of the acquired EEL spectra. Following the decomposition analysis of the data with PCA, blind source separation (BSS) was used for identifying statistically independent components from the multivariate data, and generating the elemental maps, identifying the location of the alumina network.

The EELS spectra were analysed and the elemental maps were generated using the open source Hyperspy toolbox.

Scanning electron microscopy (SEM) images were acquired using the in-lens detector in a LEO 1550 system. The acceleration voltage was set at 10 kV.

No doubt many other effective alternatives will occur to the skilled person. It will be understood that the invention is not limited to the described embodiments and encompasses modifications apparent to those skilled in the art and lying within the spirit and scope of the claims appended hereto.

The invention claimed is:

1. A luminescent device comprising: a substrate, and a film comprising semiconducting perovskite crystals deposited on the substrate, wherein the film comprising semiconducting perovskite crystals is encapsulated with a layer or within a matrix; wherein the layer or the matrix comprises an insulating oxide or an insulating nitride; wherein the semiconducting perovskite crystals consist of an organometal halide perovskite or a metal-metal halide perovskite material.

2. The luminescent device according to claim 1, wherein the layer or the matrix ef comprising the insulating oxide or insulating nitride prevents a reduction of a photoluminescence yield of said semiconducting perovskite crystals during operation of the luminescent device; and/or a photoluminescence yield of the semiconducting perovskite crystals is the same or higher than a photoluminescence yield of pristine, non-encapsulated semiconducting perovskite crystals; and/or said film comprising semiconducting perovskite crystals has improved stability to thermal degradation compared to an equivalent film comprising semiconducting perovskite crystals which is not encapsulated with a layer or within a matrix comprising insulating oxide or insulating nitride.

3. The luminescent device according to claim 1, wherein the semiconducting perovskite crystals comprise perovskite nanocrystals, perovskite nanoparticles, perovskite nanowires, and perovskite quantum dots.

4. The luminescent device according to claim 1, wherein the insulating oxide or insulating nitride is selected from aluminium oxide, silicon dioxide, titanium oxide, nickel oxide, magnesium oxide, zinc oxide, titanium nitride and silicon nitride.

5. The luminescent device according to claim 1, wherein the layer or the matrix comprising the insulating oxide or insulating nitride is from 5 to 1000 nm thick.

6. The luminescent device according to claim 1, wherein the photoluminescence yield of said luminescent device is at least 50%; or wherein the photoluminescence yield of said luminescent device is from 50-80%; or wherein said luminescent device retains at least 95% of its photoluminescence yield after exposing it to water at 20° C. for 1 minute.

7. The luminescent device according to claim 1, wherein the organometal halide perovskite material or metal-metal halide perovskite has an $A_{1-i}B_iMX_3$ structure, wherein:
   A and B are each a monovalent cation, where A and B are different;
   M is a divalent metal cation;
   X is a halide anion; and
   i is between 0 and 1; or
   the organometal halide perovskite or metal-metal halide perovskite material has an $AMX_{3-k}Y_k$ structure, wherein:
   A is a monovalent cation;
   M is a divalent metal cation;
   X and Y are each a halide anion, where X and Y are different; and
   k is between 0 and 3; or
   the organometal halide perovskite material or metal-metal halide perovskite has an $AM_{1-j}N_jX_3$ structure, wherein:
   A is a monovalent cation;
   M and N are each a divalent metal cation;
   X is a halide anion; and
   j is between 0 and 1; or
   the organometal halide perovskite material or metal-metal halide perovskite has an $A_{1-i}B_iM_{1-j}N_jX_{3-k}Y_k$ structure, wherein:
   A and B are each a monovalent cation, where A and B are different;
   M and N are each a divalent metal cation;
   X and Y are each a halide anion, where X and Y are different; and
   where i is between 0 and 1, j is between 0 and 1, and k is between 0 and 3.

8. The luminescent device according to claim 1, wherein the layer or the matrix comprises a metal oxide and a metal hydroxide.

9. The luminescent device according to claim 1, wherein the luminescent device is selected from a photoluminescent device or an electroluminescent device.

10. The luminescent device according to claim 1, wherein said organometal halide perovskite or metal-metal halide perovskite has an $AMX_3$ structure, where A is a monovalent cation, M is a divalent cation and X is a halide anion;
   wherein the divalent cation M may be a divalent metal cation, tin ($Sn^{2+}$), or lead ($Pb^{2+}$); and/or
   wherein the monovalent cation may be:
      an alkali metal cation, caesium ($Cs^+$), or rubidium ($Rb^+$); or
      a primary, secondary or tertiary ammonium cation $[HNR^1R^2R^3]^+$, wherein each of $R^1$, $R^2$ and $R^3$ is the same or is different and is selected from hydrogen, an unsubstituted or substituted $C_1$-$C_{20}$ alkyl group and an unsubstituted or substituted $C_5$-$C_{18}$ aryl group; or is of the form $[R^1R^2N\!-\!CH\!=\!NR^3R^4]^+$:

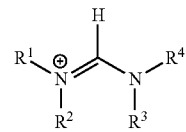

wherein each of $R^1$, $R^2$, $R^3$ and $R^4$ is the same or is different and is selected from hydrogen, an unsubstituted or substituted $C_1$-$C_{20}$ alkyl group and an unsubstituted or substituted $C_5$-$C_{18}$ aryl group; or
is of the form $(R^1R^2N)(R^3R^4N)C\!=\!NR^5R^6$:

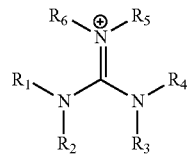

wherein each of $R^1$ $R^2$, $R^3$, $R^4$, $R^5$ and $R^6$ is the same or is different and is selected from hydrogen, an unsubstituted or substituted $C_1$-$C_{20}$ alkyl group and an unsubstituted or substituted $C_5$-$C_{18}$ aryl group; and/or
wherein X may be a halide anion selected from chloride, bromide, iodide, and fluoride and, in the $AMX_3$ structure each halide is the same or is different.

11. The luminescent device according to claim 1, wherein said organometal halide perovskite or metal-metal halide perovskite contains an AMX3 structure, where A is a monovalent cation, M is a divalent cation and X is a halide anion.

12. The luminescent device according to claim 4, wherein the insulating oxide or insulating nitride is an insulating oxide and is aluminium oxide.

13. A method of manufacturing a luminescent device, the method comprising:
   providing a substrate;
   depositing a film comprising semiconducting perovskite crystals on the substrate; and
   depositing on the film comprising semiconducting perovskite crystals an encapsulating layer or matrix, wherein the encapsulating layer or matrix comprises an insulating oxide or an insulating nitride from precursors therefor;
   wherein said film comprising semiconducting perovskite crystals is deposited on the substrate from a colloidal preparation of perovskite nanocrystals; and/or
   wherein the encapsulating layer or matrix of an insulating oxide or an insulating nitride is deposited on the film comprising semiconducting perovskite crystals by a thin-film deposition method selected from chemical vapour deposition, vacuum atomic layer deposition and atmospheric atomic layer deposition; and/or
   wherein the insulating oxide and precursors therefor are selected from: aluminium oxide, where the precursors are trimethylaluminium, water and oxygen; silicon dioxide, where the precursors are tetraethoxysilane and ammonia; titanium oxide, were the precursors are titanium tetrachloride and water; and zinc oxide, where the precursors are diethylzinc and water; and/or
   wherein the layer or matrix of the insulating oxide or insulating nitride is deposited on the film comprising semiconducting perovskite crystals at a temperature of from 20-100° C.; and/or wherein the layer or matrix of the insulating oxide or insulating nitride is deposited on the film comprising semiconducting perovskite crystals at a thickness of from 5 to 1000 nm; and/or wherein the film comprising semiconducting perovskite crystals is deposited on the substrate by spin coating; and/or wherein the perovskite crystals consist of an organometal halide perovskite or a metal-metal halide perovskite material, preferably having an $AMX_3$ structure, an $A_{1-i}B_iMX_3$ structure, an $AMX_{3-1}Y_k$ structure, an $AM_{1-j}N_jX_3$ structure, or an $A_{1-i}B_iM_{1-j}N_jX_{3-k}Y_k$ structure; and/or wherein the encapsulating layer or matrix comprising an insulating oxide or an insulating nitride is formed during or following synthesis of the semiconducting perovskite crystals.

14. The method according to claim 13, comprising forming a light-emissive device incorporating the luminescent device.

15. A method for preparing a luminescent device, the method comprising:
providing a substrate;
depositing a film comprising semiconducting perovskite crystals onto said substrate; and
encapsulating said semiconducting perovskite crystals with an insulating layer or a matrix; wherein the insulating layer or the matrix comprises a metal oxide and a metal hydroxide.

16. The method as claimed in claim 15, wherein said encapsulating comprises exposing said semiconducting perovskite crystals to a precursor for said insulating layer or said matrix, and subsequently exposing said semiconducting perovskite crystals to moisture to hydrolyse a material of said precursor to form said insulating layer or said matrix.

17. The luminescent device according to claim 8, wherein said metal oxide comprises aluminium oxide and wherein said metal hydroxide comprises aluminium hydroxide; and/or wherein said metal oxide and metal hydroxide covalently bond to ligands attached to said semiconducting perovskite crystals.

* * * * *